(12) United States Patent
Gao et al.

(10) Patent No.: US 12,068,333 B2
(45) Date of Patent: Aug. 20, 2024

(54) DISPLAY SUBSTRATE, DISPLAY PANEL, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tao Gao, Beijing (CN); Peng Huang, Beijing (CN); Bingqiang Gui, Beijing (CN); Ke Yang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 469 days.

(21) Appl. No.: 17/310,401

(22) PCT Filed: Sep. 30, 2020

(86) PCT No.: PCT/CN2020/119347
§ 371 (c)(1),
(2) Date: Jul. 30, 2021

(87) PCT Pub. No.: WO2022/067648
PCT Pub. Date: Apr. 7, 2022

(65) Prior Publication Data
US 2022/0320227 A1    Oct. 6, 2022

(51) Int. Cl.
*H01L 27/12* (2006.01)
*H01L 29/786* (2006.01)
(Continued)

(52) U.S. Cl.
CPC ...... *H01L 27/1251* (2013.01); *H01L 27/1225* (2013.01); *H01L 29/78648* (2013.01);
(Continued)

(58) Field of Classification Search
CPC ............ H01L 27/1225; H01L 27/1251; H01L 29/78648
See application file for complete search history.

(56) References Cited

U.S. PATENT DOCUMENTS

| 10,056,037 B1 | 8/2018 | Nie |
| 10,304,920 B2 | 5/2019 | Choi et al. |

(Continued)

FOREIGN PATENT DOCUMENTS

| CN | 105612608 A | 5/2016 |
| CN | 106504699 A | 3/2017 |

(Continued)

*Primary Examiner* — Peter M Albrecht
(74) *Attorney, Agent, or Firm* — Kinney & Lange, P.A.

(57) ABSTRACT

A display substrate, a display panel, and a display device are provided. The display substrate includes: a base substrate; a first semiconductor layer on the base substrate; and a second semiconductor layer on a side of the first semiconductor layer away from the base substrate. The display substrate further includes a plurality of thin film transistors on the base substrate, which at least include a first transistor, a second transistor and a third transistor. Each of the plurality of thin film transistors includes an active layer. The active layer of at least one of the first transistor and the second transistor is located in the second semiconductor layer and contains an oxide semiconductor material. The active layer of the third transistor is located in the first semiconductor layer and contains a polysilicon semiconductor material. At least one of the first transistor and the second transistor has a dual-gate structure.

16 Claims, 21 Drawing Sheets

(51) Int. Cl.
*H10K 59/131* (2023.01)
*G09G 3/3233* (2016.01)
*H10K 59/35* (2023.01)

(52) U.S. Cl.
CPC ......... *H10K 59/131* (2023.02); *G09G 3/3233* (2013.01); *G09G 2300/0426* (2013.01); *H10K 59/351* (2023.02)

(56) References Cited

U.S. PATENT DOCUMENTS

| | | | |
|---|---|---|---|
| 10,658,448 B2 | 5/2020 | Choi et al. | |
| 11,127,768 B2 | 9/2021 | Fu | |
| 2010/0255619 A1* | 10/2010 | Kwon | H01L 27/1255 438/34 |
| 2016/0163745 A1* | 6/2016 | Choi | H01L 27/1225 257/40 |
| 2016/0247831 A1 | 8/2016 | Makita et al. | |
| 2017/0033133 A1 | 2/2017 | Makita et al. | |
| 2017/0162606 A1* | 6/2017 | Yan | H01L 27/1251 |
| 2018/0102400 A1 | 4/2018 | Choi et al. | |
| 2018/0240402 A1 | 8/2018 | Nie | |
| 2019/0288051 A1 | 9/2019 | Choi et al. | |
| 2020/0135935 A1 | 4/2020 | Yuan | |
| 2020/0279901 A1 | 9/2020 | Choi et al. | |
| 2021/0098509 A1 | 4/2021 | Fu | |

FOREIGN PATENT DOCUMENTS

| | | |
|---|---|---|
| CN | 107919378 A | 4/2018 |
| CN | 110491887 A | 11/2019 |
| CN | 110707098 A | 1/2020 |
| IN | 110649044 A | 1/2020 |
| KR | 20140080729 A | 7/2014 |

* cited by examiner

DISPLAY SUBSTRATE, DISPLAY PANEL, AND DISPLAY DEVICE

CROSS-REFERENCE TO RELATED APPLICATION

This application is a Section 371 National Stage Application of International Application No. PCT/CN2020/119347, filed on Sep. 30, 2020, entitled "DISPLAY SUBSTRATE, DISPLAY PANEL AND DISPLAY DEVICE", which is incorporated herein by reference in its entirety.

TECHNICAL FIELD

The present disclosure relates to a field of display technology, and in particular to a display substrate, a display panel and a display device.

BACKGROUND

Organic light emitting diode (OLED) display device is a type of display device that displays information such as images by using a luminous OLED. OLED display device has characteristics such as low power consumption, high brightness, and high response speed. Low Temperature Polycrystalline Oxide TFT (LTPO TFT) technology is a new thin film transistor technology in recent years. In theory, LTPO TFT may save 5-15% of power compared to traditional Low Temperature Poly-Silicon TFT (LTPS TFT) technology, so that power consumption of the entire display screen is lower.

The above information disclosed in this section is only for the understanding of the background of the inventive concept of the present disclosure. Therefore, the above information may contain information that does not constitute the related art.

SUMMARY

In one aspect, there is provided a display substrate, including: a base substrate; a first semiconductor layer arranged on the base substrate; and a second semiconductor layer arranged on a side of the first semiconductor layer away from the base substrate, wherein the display substrate further includes a plurality of thin film transistors arranged on the base substrate, the plurality of thin film transistors at least include a first transistor and a third transistor, each of the plurality of thin film transistors includes an active layer, the active layer of the first transistor is located in the second semiconductor layer and contains an oxide semiconductor material, the active layer of the third transistor is located in the first semiconductor layer and contains a polysilicon semiconductor material; wherein the first transistor includes a first bottom gate electrode located between the base substrate and the active layer of the first transistor, and a first top gate electrode located on a side of the active layer of the first transistor away from the base substrate, and any two of an orthographic projection of the active layer of the first transistor on the base substrate, an orthographic projection of the first bottom gate electrode on the base substrate and an orthographic projection of the first top gate electrode on the base substrate at least partially overlaps each other; wherein the display substrate includes a first conductive layer and a second conductive layer arranged on the base substrate, the first conductive layer is located on a side of the first semiconductor layer away from the base substrate, and the second conductive layer is located between the first conductive layer and the second semiconductor layer; wherein the third transistor includes a gate electrode located in the first conductive layer, and a source electrode and a drain electrode located in the second conductive layer; and wherein the first bottom gate electrode is located in the second conductive layer.

According to some exemplary embodiments, the display substrate further includes a second transistor, the second transistor includes a second bottom gate electrode located between the base substrate and the active layer of the second transistor, and a second top gate electrode located on a side of the active layer of the second transistor away from the base substrate, any two of an orthographic projection of the active layer of the second transistor on the base substrate, an orthographic projection of the second bottom gate electrode on the base substrate and an orthographic projection of the second top gate electrode on the base substrate at least partially overlaps each other, the active layer of the second transistor is located in the second semiconductor layer and contains an oxide semiconductor material, and the second bottom is located in the second conductive layer.

According to some exemplary embodiments, the display substrate further includes a storage capacitor including a first capacitor electrode and a second capacitor electrode arranged on the base substrate, and an orthographic projection of the first capacitor electrode on the base substrate at least partially overlaps an orthographic projection of the second capacitor electrode on the base substrate; the second capacitor electrode is located in the second conductive layer, and the first capacitor electrode is located in the first conductive layer.

According to some exemplary embodiments, the display substrate further includes a first bottom gate structure located in the second conductive layer, the first bottom gate structure includes a first bottom gate body portion and a first bottom gate extension portion, an orthographic projection of the first bottom gate body portion on the base substrate at least partially overlaps the orthographic projection of the active layer of the first transistor on the base substrate, and the first bottom gate electrode includes a portion of the first bottom gate body portion that overlaps the active layer of the first transistor; and/or the display substrate includes a second bottom gate structure located in the second conductive layer, the second bottom gate structure includes a second bottom gate body portion and a second bottom gate extension portion, an orthographic projection of the second bottom gate body portion on the base substrate at least partially overlaps the orthographic projection of the active layer of the second transistor on the base substrate, and the second bottom gate electrode includes a portion of the second bottom gate body portion that overlaps the active layer of the second transistor.

According to some exemplary embodiments, the display substrate further includes a data line for transmitting a data signal, the data line extends in a first direction on the base substrate, and at least one of the first bottom gate extension portion and the second bottom gate extension portion extends in the first direction; at least one of the active layer of the first transistor and the active layer of the second transistor extends in the first direction.

According to some exemplary embodiments, the display substrate further includes a third conductive layer located on a side of the second semiconductor layer away from the base substrate, and a first top gate structure located in the third conductive layer, the first top gate structure extends in a second direction intersecting the first direction; the first top gate structure includes a first widened portion, a size of the first widened portion in the first direction is greater than that of a remaining portion of the first top gate structure in the first direction; and an orthographic projection of the first widened portion on the base substrate at least partially overlaps the orthographic projection of the active layer of the first transistor on the base substrate, and the first top gate electrode includes a portion of the first widened portion that overlaps the active layer of the first transistor.

According to some exemplary embodiments, the display substrate further includes a second top gate structure located in the third conductive layer, and the second top gate structure extends in the second direction; the second top gate structure includes a second widened portion, a size of the second widened portion in the first direction is greater than that of a remaining portion of the second top gate structure in the first direction; and an orthographic projection of the second widened portion on the base substrate at least partially overlaps the orthographic projection of the active layer of the second transistor on the base substrate, and the second top gate electrode includes a portion of the second widened portion that overlaps the active layer of the second transistor.

According to some exemplary embodiments, the first widened portion protrudes to both sides with respect to the remaining portion of the first top gate structure in the first direction; and/or the second widened portion protrudes to both sides with respect to the remaining portion of the second top gate structure in the first direction.

According to some exemplary embodiments, the display substrate further includes a fourth conductive layer located on a side of the third conductive layer away from the base substrate, the first transistor includes a first source electrode and a first drain electrode, the second transistor includes a second source electrode and a second drain electrode, and the first source electrode, the first drain electrode, the second source electrode and the second drain electrode are located in the fourth conductive layer.

According to some exemplary embodiments, the display substrate further includes: an initialization voltage line located in the third conductive layer, wherein the initialization voltage line is configured to transmit an initialization voltage signal; and a first conductive component located in the fourth conductive layer, wherein the first conductive component has one end electrically connected to the active layer of the first transistor through a first via hole, and a portion of the first conductive component is electrically connected to the initialization voltage line through a second via hole.

According to some exemplary embodiments, the display substrate further includes a second conductive component and a third conductive component located in the fourth conductive layer; the second conductive component has one end electrically connected to the active layer of the second transistor through a third via hole, and the other end electrically connected to the active layer of the first transistor and one end of the third conductive component through a fourth via hole; the other end of the third conductive component is electrically connected to the gate electrode of the third transistor and the first capacitor electrode through a fifth via hole.

According to some exemplary embodiments, the display substrate further includes a light emitting device arranged on the base substrate, the light emitting device includes at least a first electrode located on a side of the fourth conductive layer away from the base substrate; an orthographic projection of the first electrode on the base substrate at least partially overlaps the orthographic projection of the active layer of the first transistor on the base substrate.

According to some exemplary embodiments, the orthographic projection of the first electrode on the base substrate is spaced from the orthographic projection of the active layer of the second transistor on the base substrate.

According to some exemplary embodiments, the display substrate further includes a pixel defining layer and a spacer arranged on the base substrate, the pixel defining layer includes an opening that exposes at least portion of the first electrode, and the spacer is located on a side of the pixel defining layer away from the base substrate; an orthographic projection of the spacer on the base substrate at least partially overlaps the orthographic projection of the active layer of the second transistor on the base substrate.

According to some exemplary embodiments, the display substrate further includes: a first buffer layer located between the base substrate and the first semiconductor layer, wherein the first buffer layer contains silicon oxide or silicon nitride; and/or a first gate insulating layer located between the first semiconductor layer and the first conductive layer, wherein the first gate insulating layer contains silicon oxide; and/or a second buffer layer located between the second conductive layer and the second semiconductor layer, wherein the second buffer layer contains silicon oxide; and/or a second gate insulating layer located between the second semiconductor layer and the third conductive layer, wherein the second gate insulating layer contains silicon oxide.

According to some exemplary embodiments, the display substrate is a bendable flexible display substrate including a display area and a bending area; the display substrate further includes a groove located in the bending area, and the groove exposes at least portion of the base substrate located in the bending area.

According to some exemplary embodiments, the display substrate further includes a wire located in the bending area, the wire is located in the fourth conductive layer and on a bottom of the groove.

According to some exemplary embodiments, the display substrate further includes: a passivation layer located on a side of the fourth conductive layer away from the base substrate, wherein a portion of the passivation layer at least covers the wire; and a planarization layer located on a side of the passivation layer away from the base substrate, wherein the planarization layer is filled in the groove.

In another aspect, there is provided a display panel, including the display substrate described above.

In yet another aspect, there is provided a display device, including the display substrate or the display panel described above.

BRIEF DESCRIPTION OF THE DRAWINGS

By describing exemplary embodiments of the present disclosure in detail with reference to the drawings, the features and advantages of the present disclosure will become more apparent.

DETAILED DESCRIPTION OF EMBODIMENTS

Figure 1:
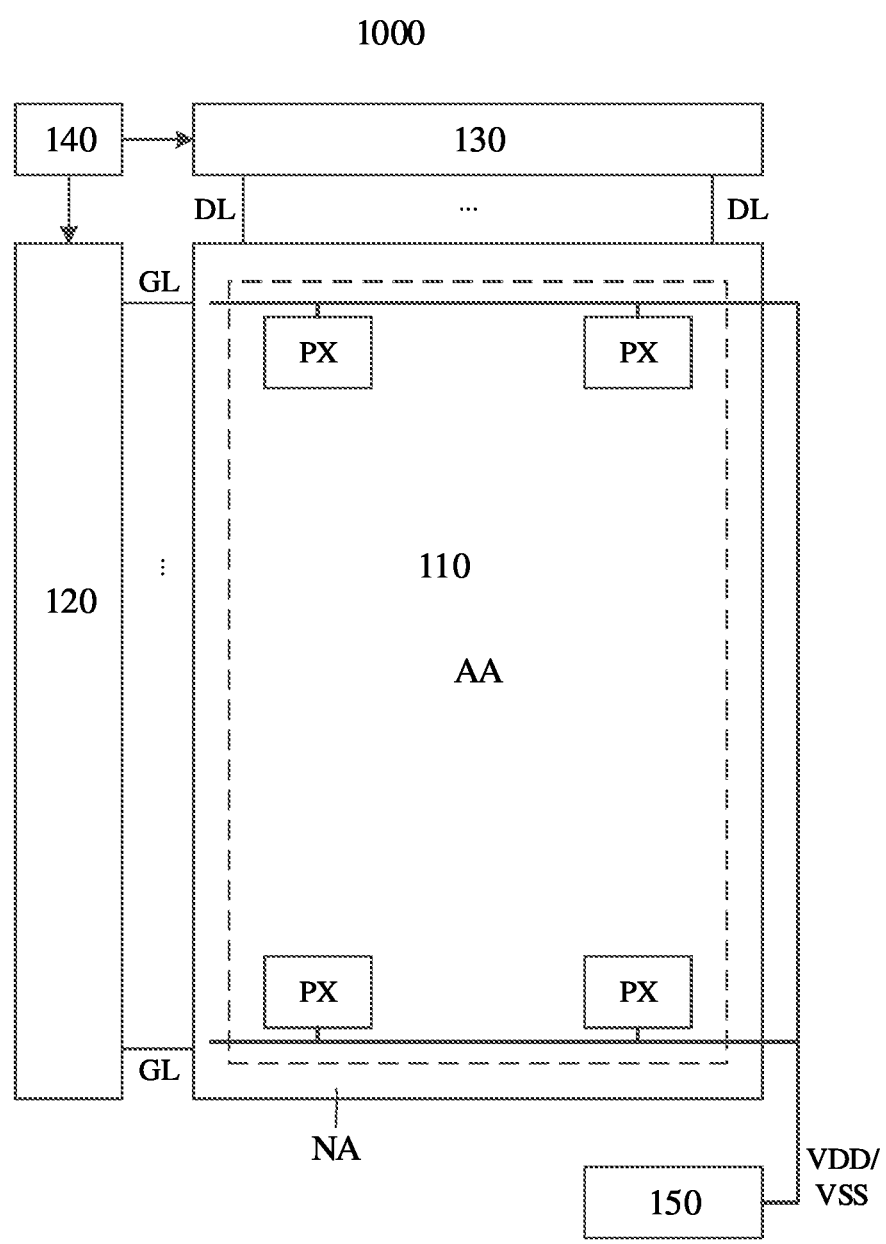
FIG. 1 shows a schematic plan view of a display device according to some embodiments of the present disclosure.

In order to make objectives, technical solutions and advantages of the present disclosure more clear, the technical solutions of the embodiments of the present disclosure are clearly and completely described below with reference to the drawings. Obviously, the described embodiments are only a part but not all of the embodiments of the present disclosure. Based on the embodiments of the present disclosure, all other embodiments obtained by those ordinary skilled in the art without carrying out inventive effort fall within the protection scope of the present disclosure.

It should be noted that, in the drawings, for clarity and/or description purposes, size and relative size of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is present. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X axis, Y axis and Z axis are not limited to three axes of a rectangular coordinate system, and may be interpreted in a broader meaning. For example, the X axis, the Y axis and the Z axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", may be used herein to describe the relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

In the present disclosure, unless otherwise specified, the terms "substantially", "basically", "about", "approximately" and other similar terms are used as terms of approximation rather than as terms of degree, and they are intended to explain the inherent deviation of the measured or calculated value that will be recognized by those ordinary skilled in the art. Taking into account actual process errors, measurement problems, and errors related to measurement of specific quantities (that is, limitations of a measurement system), the terms "substantially", "basically", "about" or "approximately" used in the present disclosure includes the stated value and means that the specific value determined by those ordinary skilled in the art is within an acceptable range of deviation. For example, "substantially", "basically", "about" or "approximately" may mean within one or more standard deviations, or within ±30%, ±20%, ±10% or ±5% of the stated value.

It should be noted that the expression "same layer" refers to a layer structure formed by first using the same film forming process to form a film layer for forming a specific pattern, and then using the same mask to pattern the film layer by using one-time patterning process. Depending on the specific patterns, the one-time patterning process may include multiple exposure, development or etching processes, and the specific pattern in the layer structure formed may be continuous or discontinuous. That is to say, a plurality of elements, components, structures and/or parts located in the "same layer" are made of the same material and formed by the same patterning process. Generally, a plurality of elements, components, structures and/or parts located in the "same layer" have roughly the same thickness.

Those skilled in the art should understand that in the present disclosure, unless otherwise specified, the expression "height" or "thickness" refers to a size in a direction perpendicular to a surface of each film layer arranged in the display substrate, that is, a size in the light emitting direction of the display substrate, or called a size in a normal direction of the display device.

The embodiments of the present disclosure provide at least a display substrate. The display substrate includes: a base substrate; a first semiconductor layer arranged on the base substrate; and a second semiconductor layer arranged on a side of the first semiconductor layer away from the base substrate. The display substrate further includes a plurality of thin film transistors arranged on the base substrate, and the plurality of thin film transistors at least include a first transistor, a second transistor and a third transistor. Each of the plurality of thin film transistors includes an active layer. At least one of the active layer of the first transistor and the active layer of the second transistor is located in the second semiconductor layer and contains an oxide semiconductor material, and the active layer of the third transistor is located in the first semiconductor layer and contains a polysilicon semiconductor material. At least one of the first transistor and the second transistor has a dual-gate structure. In the embodiments of the present disclosure, at least one of the active layer of the first transistor and the active layer of the second transistor is formed of an oxide semiconductor material such as LTPO, and has a dual-gate structure, so that the display performance of the display panel may be improved.

FIG. 1 shows a schematic plan view of a display device according to some embodiments of the present disclosure. For example, the display device may be an OLED display device. Referring to FIG. 1, a display device 1000 may include a display panel 110, a gate driver 120, a data driver 130, a controller 140, and a voltage generator 150. For example, the display device 1000 may be an OLED display device. The display panel 110 may include an array substrate 100 and a plurality of pixels PX. The array substrate 100 may include a display area AA and a non-display area NA, and the plurality of pixels PX are arranged in an array in the display area AA. A signal generated by the gate driver 120 may be applied to the pixel PX through a signal line such as a scan signal line GL, and a signal generated by the data driver 130 may be applied to the pixel PX through a signal line such as a data line DL. A first voltage such as VDD and a second voltage such as VSS may be applied to the pixel PX. The first voltage such as VDD may be higher than the second voltage such as VSS. Optionally, the first voltage such as VDD may be applied to an anode of a light emitting device (for example, OLED), and the second voltage such as VSS may be applied to a cathode of the light emitting device, so that the light emitting device may emit light.

For example, each pixel PX may include a plurality of sub-pixels, such as a red sub-pixel, a green sub-pixel and a blue sub-pixel, or may include a white sub-pixel, a red sub-pixel, a green sub-pixel and a blue sub-pixel.

Figure 2:
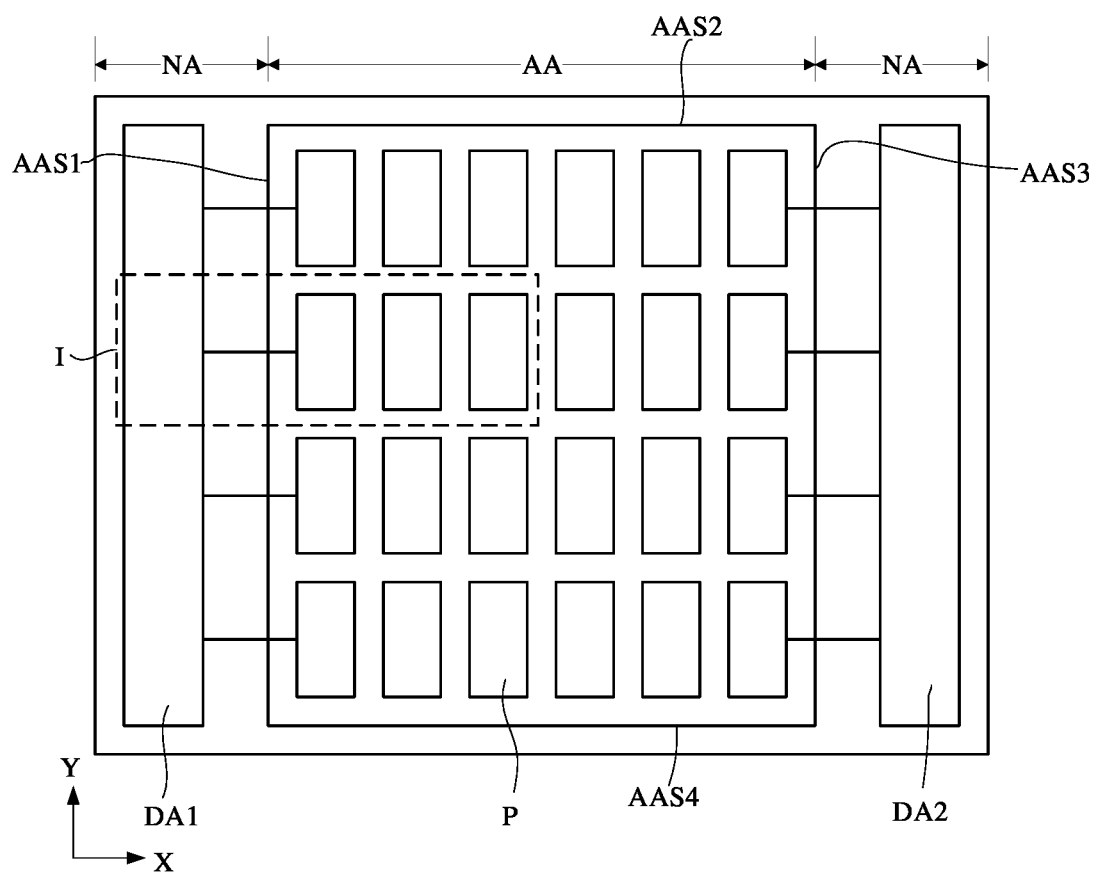
FIG. 2 shows a schematic plan view of a display substrate of a display device according to some embodiments of the present disclosure.

FIG. 2 shows a schematic plan view of a display substrate of a display device according to some embodiments of the present disclosure. For example, the display substrate may be an array substrate for an OLED display panel.

Referring to FIG. 2, the display substrate may include a display area AA and a non-display area NA. For example, the display area AA and the non-display area NA may have a plurality of boundaries, such as AAS1, AAS2, AAS3 and AAS4 as shown in FIG. 2. The display substrate may further include a driver located in the non-display area NA. For example, the driver may be located on at least one side of the display area AA. In the embodiments shown in FIG. 2, driving circuits are respectively located on left and right sides of the display area AA. It should be noted that the left and right sides may be left and right sides of the display substrate (screen) viewed by human eyes during display. The driver may be used to drive each pixel in the display substrate for display. For example, the driver may include the gate driver 120 and the data driver 130 described above. The data driver 130 is used to sequentially latch input data according to a timing of a clock signal and convert the latched data into an analog signal and then input the analog signal to each data line of the display substrate. The gate driver 120 is usually implemented by a shift register. The shift register converts the clock signal into an on/off voltage and outputs it to each scan signal line of the display substrate.

It should be noted that although FIG. 2 shows that the drivers are located on the left and right sides of the display area AA, the embodiments of the present disclosure are not limited thereto. The driving circuits may be located at any suitable position in the non-display area NA.

For example, the driver may adopt a GOA (Gate Driver on Array) technology. In the GOA technology, a gate driving circuit instead of an external driving chip is directly arranged on the array substrate. Each GOA unit acts as a stage of shift register, and each stage of shift register is connected to a gate line. The each stage of shift register outputs a turn-on voltage in turn, so that a progressive scanning of pixels is realized. In some embodiments, each stage of shift register may also be connected to a plurality of gate lines. This may adapt to a development trend of high resolution and narrow frame of the display substrate.

Referring to FIG. 2, a left GOA circuit DA1, a plurality of pixels P located in the display area AA, and a right GOA circuit DA2 are provided on the display substrate. The left GOA circuit DA1 and the right GOA circuit DA2 are electrically connected to a display IC through respective signal lines, and a supply of GOA signals is controlled by the display IC. The display IC is arranged, for example, at a lower side of the display substrate (in a direction of human eyes). The left GOA circuit DA1 and the right GOA circuit DA2 are further electrically connected to various pixels through respective signal lines (for example, scan signal lines GL) to supply driving signals to respective pixels.

Figure 3:
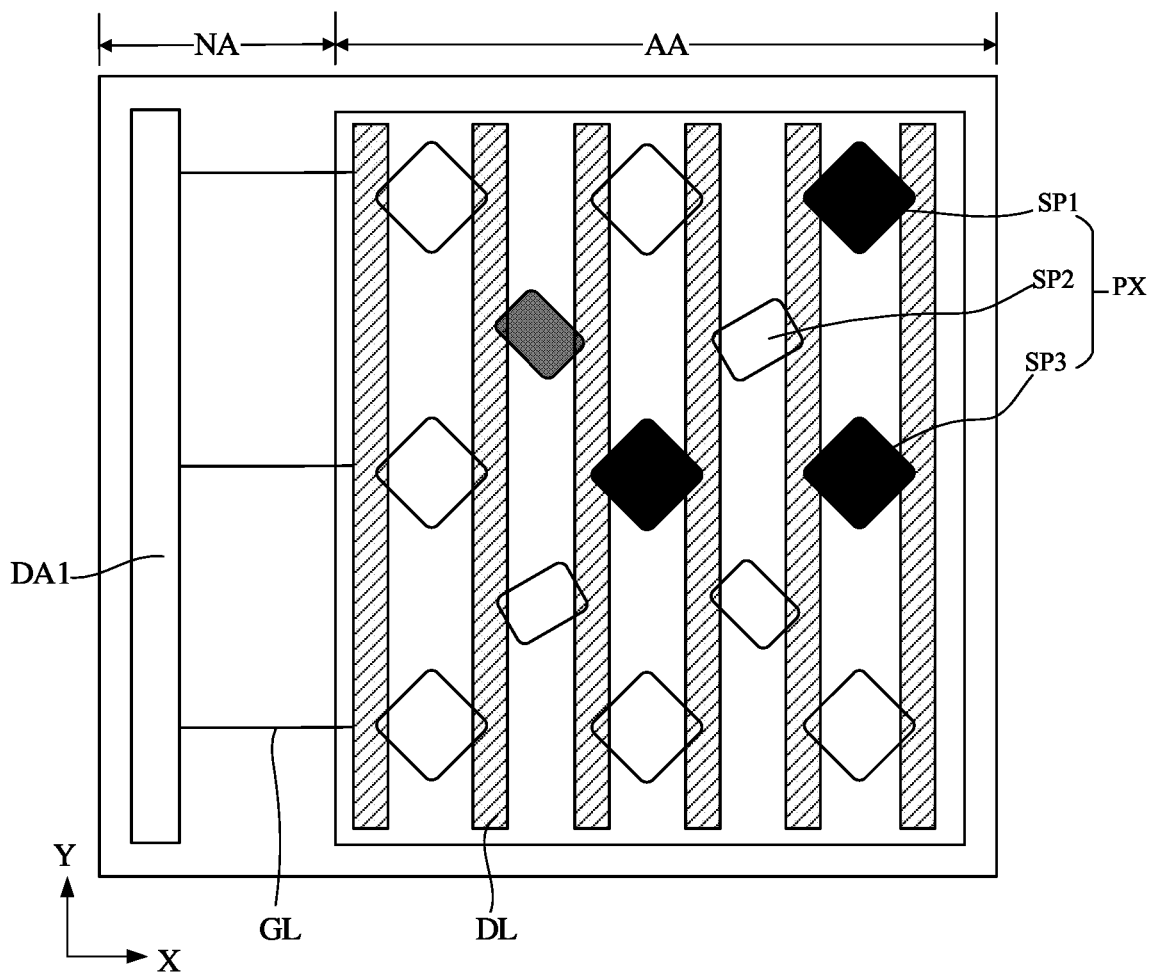
FIG. 3 shows a partial enlarged view of a display substrate at part I of FIG. 2 according to some embodiments of the present disclosure.

FIG. 3 shows a partial enlarged view of a display substrate at part I of FIG. 2 according to some embodiments of the present disclosure. It should be noted that it is exemplarily shown that an orthographic projection of the sub-pixel on the base substrate is a rounded rectangle. However, the embodiments of the present disclosure are not limited thereto. For example, the orthographic projection of the sub-pixel on the base substrate may have other shapes, such as a rectangle, a hexagon, a pentagon, a square, or a circle. Moreover, an arrangement of three sub-pixels in a pixel unit is not limited to that shown in FIG. 3.

Referring to FIG. 1, FIG. 2 and FIG. 3 in combination, each pixel unit PX may include a plurality of sub-pixels, for example, a first sub-pixel SP1, a second sub-pixel SP2, and a third sub-pixel SP3. For case of understanding, the first sub-pixel SP1, the second sub-pixel SP2 and the third sub-pixel SP3 may be described as a red sub-pixel, a green sub-pixel and a blue sub-pixel, respectively. However, the embodiments of the present disclosure are not limited thereto.

The plurality of sub-pixels are arranged on the base substrate 1 in an array in a row direction X and a column direction Y. It should be noted that although in the illustrated embodiments, the row direction X and the column direction Y are perpendicular to each other, the embodiments of the present disclosure are not limited thereto.

It should be understood that, in the embodiments of the present disclosure, each sub-pixel includes a pixel driving circuit and a light emitting device. For example, the light emitting device may be an OLED light emitting device, including an anode, an organic light emitting layer and a cathode that are stacked. The pixel driving circuit may include a plurality of thin film transistors and at least one storage capacitor.

Hereinafter, a 7T1C pixel driving circuit is illustrated by way of example in describing a structure of the pixel driving circuit in detail. However, the embodiments of the present disclosure are not limited to the 7T1C pixel driving circuit. In the case of no conflict, any other known pixel driving circuit structures may be applied to the embodiments of the present disclosure.

Figure 4:
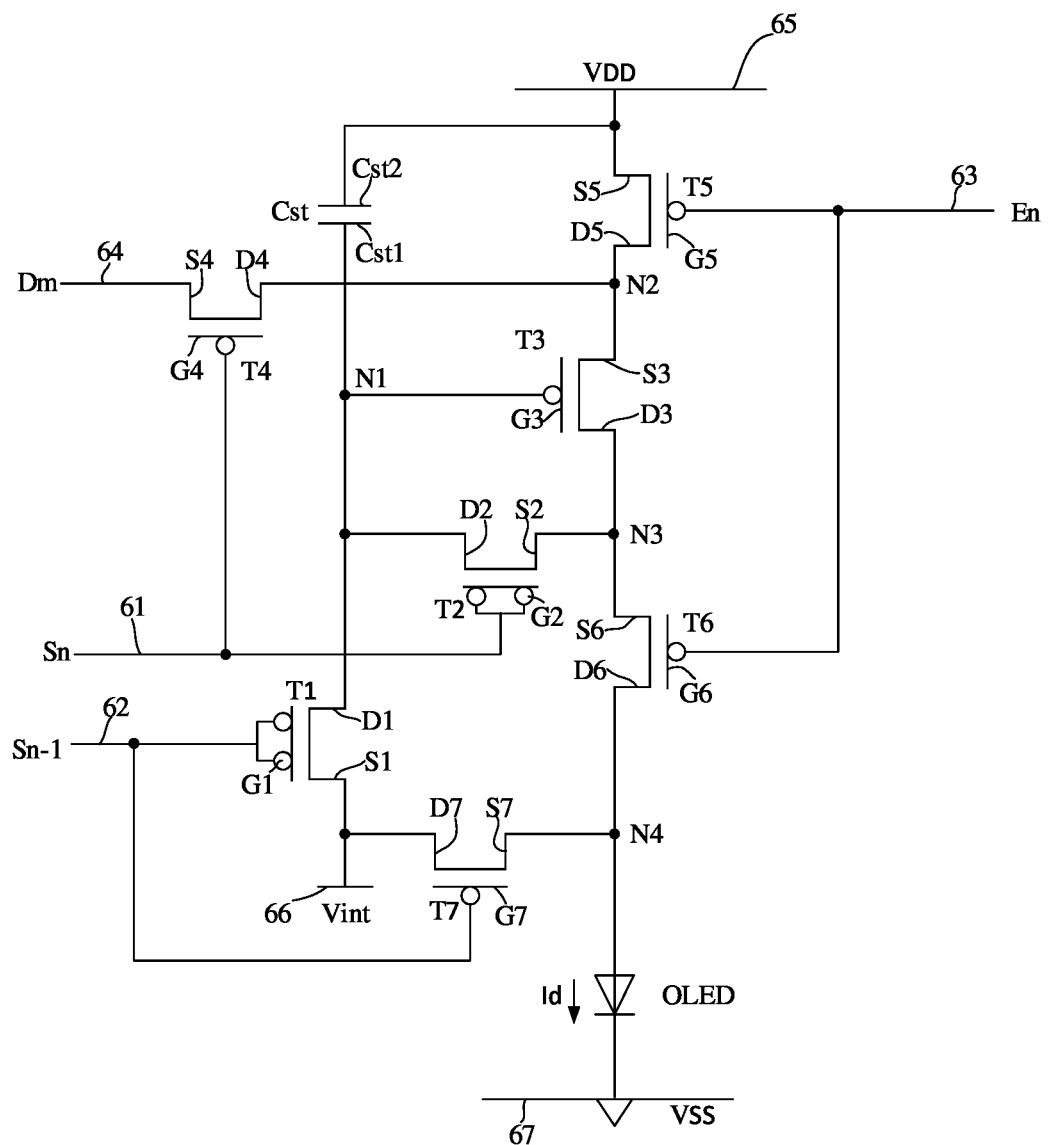
FIG. 4 shows an equivalent circuit diagram of a pixel driving circuit of a display substrate according to some exemplary embodiments of the present disclosure.

FIG. 4 shows an equivalent circuit diagram of a pixel driving circuit of a display substrate according to some exemplary embodiments of the present disclosure. As shown in FIG. 4, the pixel driving circuit may include a plurality of thin film transistors and a storage capacitor Cst. The pixel driving circuit is used to drive the organic light emitting diode (that is, OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate electrode, a source electrode, and a drain electrode.

The display substrate may further include a plurality of signal lines. For example, the plurality of signal lines include a scan signal line 61 for transmitting a scan signal Sn, a reset signal line 62 for transmitting a reset control signal RESET (that is, a scan signal of a previous line), a light emission control line 63 for transmitting a light emission control signal En, a data line 64 for transmitting a data signal Dm, a driving voltage line 65 for transmitting a driving voltage VDD, an initialization voltage signal 66 for transmitting an initialization voltage Vint, and a power line 67 for transmitting a VSS voltage.

The first transistor T1 has a gate electrode G1 electrically connected to the reset signal line 62, a source electrode S1 electrically connected to the initialization voltage line 66, and a drain electrode D1 electrically connected to one end Cst1 of the storage capacitor Cst1, a drain electrode D2 of the second transistor T2 and a gate electrode G3 of the third transistor T3. As shown in FIG. 4, the drain electrode D1 of the first transistor T1, the one end Cst1 of the storage capacitor Cst1, the drain electrode D2 of the second transistor T2 and the gate electrode G3 of the third transistor T3 are electrically connected at a node N1. The first transistor T1 is turned on according to the reset control signal RESET transmitted through the reset signal line 62 so as to transmit the initialization voltage Vint to the gate electrode G1 of the third transistor T3, so that an initialization operation is performed to initialize the voltage of the gate electrode G3 of the third transistor T3. That is to say, the first transistor T1 is also referred to an initialization transistor.

The second transistor T2 has a gate electrode G2 electrically connected to the scan signal line 61, a source electrode S2 electrically connected to anode N3, and the drain electrode D2 electrically connected to the node N1. The second transistor T2 is turned on according to the scan signal Sn transmitted through the scan signal line 61 so as to electrically connect the gate electrode G3 and the drain electrode D3 of the third transistor T3, so that a diode connection of the third transistor T3 is achieved.

The third transistor T3 has the gate electrode G3 electrically connected to the node N1, a source electrode S3 electrically connected to a node N2, and the drain electrode D3 electrically connected to the node N3. The third transistor T3 receives the data signal Dm according to a switching operation of the fourth transistor T4 so as to supply a driving current Id to the OLED. That is to say, the third transistor T3 is also referred to as a driving transistor.

The fourth transistor T4 has a gate electrode G4 electrically connected to the scan signal line 61, a source electrode S4 electrically connected to the data line 64, and a drain electrode D4 electrically connected to the node N2 (that is, to the source electrode S3 of the third transistor T3). The fourth transistor T4 is turned on according to the scan signal Sn transmitted through the scan signal line 61, so that a switching operation is performed to transmit the data signal Dm to the source electrode S3 of the third transistor T3.

The fifth transistor T5 has a gate electrode G5 electrically connected to the light emission control line 63, a source electrode S5 electrically connected to the driving voltage line 65, and a drain electrode D5 electrically connected to the node N2.

The sixth transistor T6 has a gate electrode G6 electrically connected to the light emission control line 63, a source electrode S6 electrically connected to the node N3, and a drain electrode D6 electrically connected to a node N4 (that is, to the anode of the OLED). The fifth transistor T5 and the sixth transistor T6 are turned on concurrently (for example, simultaneously) according to the light emission control signal En transmitted through the light emission control line 63 so as to transmit the driving voltage VDD to the OLED, thereby allowing the driving current Id to flow into the OLED.

The seventh transistor T7 has a gate electrode G7 electrically connected to the reset signal line 62, a source electrode S7 electrically connected to the node N4, and a drain electrode D7 electrically connected to the initialization voltage line 66.

The storage capacitor Cst has one end (hereinafter referred to as a first capacitor electrode) Cst1 electrically connected to the node N1, and the other end (hereinafter referred to as a second capacitor electrode) Cst2 electrically connected to the driving voltage line 65.

The OLED has an anode electrically connected to the node N4, and a cathode electrically connected to the power line 67 to receive the common voltage VSS. Accordingly, the OLED receives the driving current Id from the third transistor T3 to emit light, so as to display an image.

It should be noted that in FIG. 4, each of the thin film transistors T1, T2, T3, T4, T5, T6 and T7 is a p-channel field effect transistor. However, the embodiments of the present disclosure are not limited thereto. At least some of the thin film transistors T1, T2, T3, T4, T5, T6 and T7 may be n-channel field effect transistors.

In operation, in an initialization stage, the reset control signal RESET having a low level is supplied through the reset signal line 62. Subsequently, the first transistor T1 is turned on based on the low level of the reset control signal RESET, and the initialization voltage Vint from the initialization voltage line 66 is transmitted to the gate electrode G1 of the third transistor T3 through the first transistor T1. Therefore, the third transistor T3 is initialized due to the initialization voltage Vint.

In a data programming stage, the scan signal Sn having a low level is supplied through the scan signal line 61. Subsequently, the fourth transistor T4 and the second transistor T2 are turned on based on the low level of the scan signal Sn. Therefore, the third transistor T3 is placed in a diode-connected state by the turned-on second transistor T2 and is biased in a forward direction.

Subsequently, a compensation voltage Dm+Vth (for example, Vth is a negative value) obtained by subtracting the threshold voltage Vth of the third transistor T3 from the data signal Dm supplied through the data line 64 is applied to the gate electrode G3 of the third transistor T3. Next, the driving voltage VDD and the compensation voltage Dm+Vth are applied to both ends of the storage capacitor Cst, so that an electric charge corresponding to a voltage difference between the ends is stored in the storage capacitor Cst.

In a light emission stage, the light emission control signal En from the light emission control line 63 changes from a high level to a low level. Subsequently, in the light emission stage, the fifth transistor T5 and the sixth transistor T6 are turned on based on the low level of the light emission control signal En.

Next, a driving current is generated based on a difference between the voltage of the gate electrode G3 of the third transistor T3 and the driving voltage VDD. The driving current Id corresponding to the difference between the driving current and a bypass current is supplied to the OLED through the sixth transistor T6.

In the light emission stage, a gate-source voltage of the third transistor T3 is maintained at (Dm+Vth)−VDD due to the storage capacitor Cst based on a current-voltage relationship of the third transistor T3. The driving current Id is proportional to $(Dm-VDD)^2$. Therefore, the driving current Id may not be affected by a variation of the threshold voltage Vth of the third transistor T3.

Figure 5:
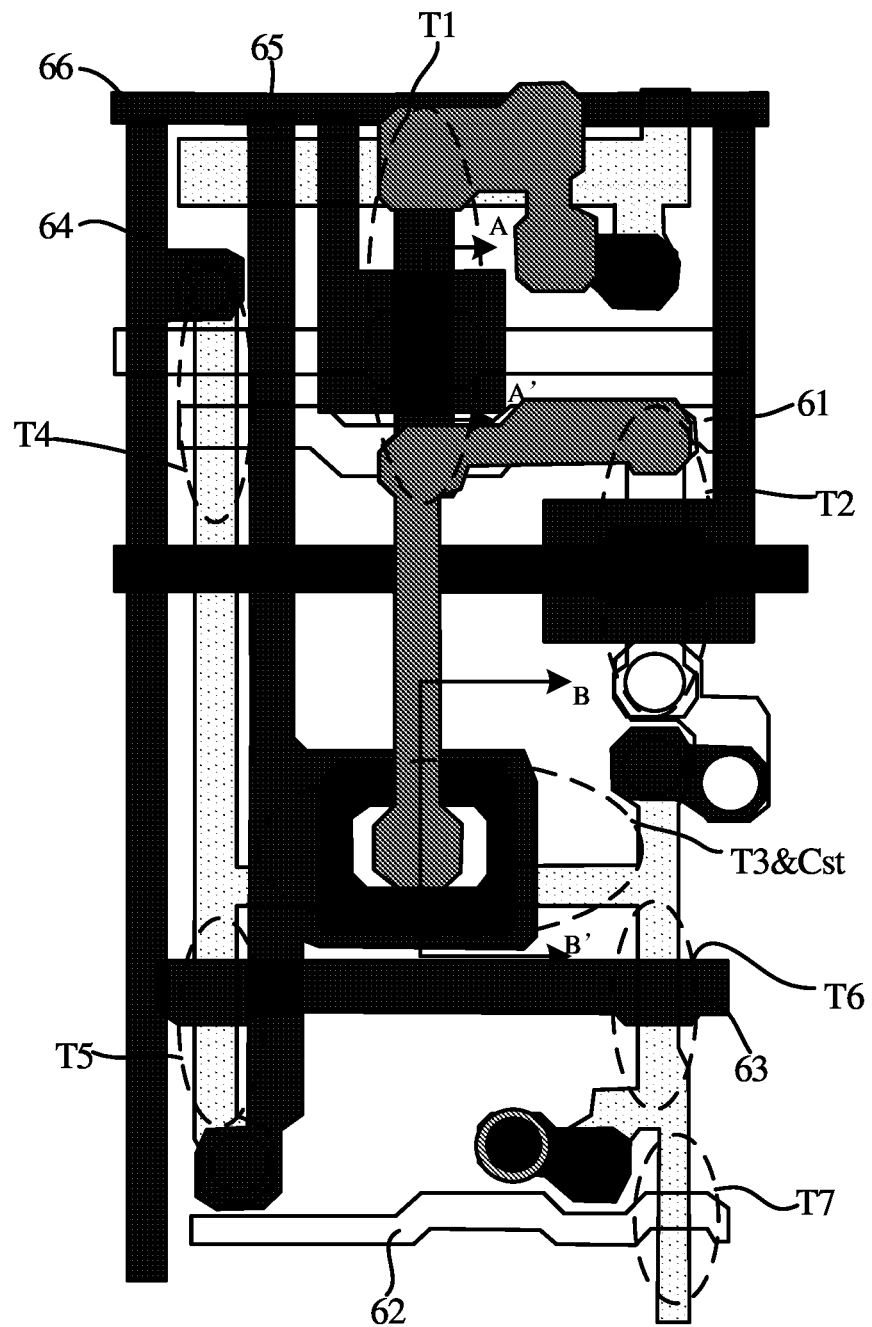
FIG. 5 shows a schematic diagram of a planar structure of a pixel driving circuit of a sub-pixel of a display substrate according to some exemplary embodiments of the present disclosure.
Figure 6:
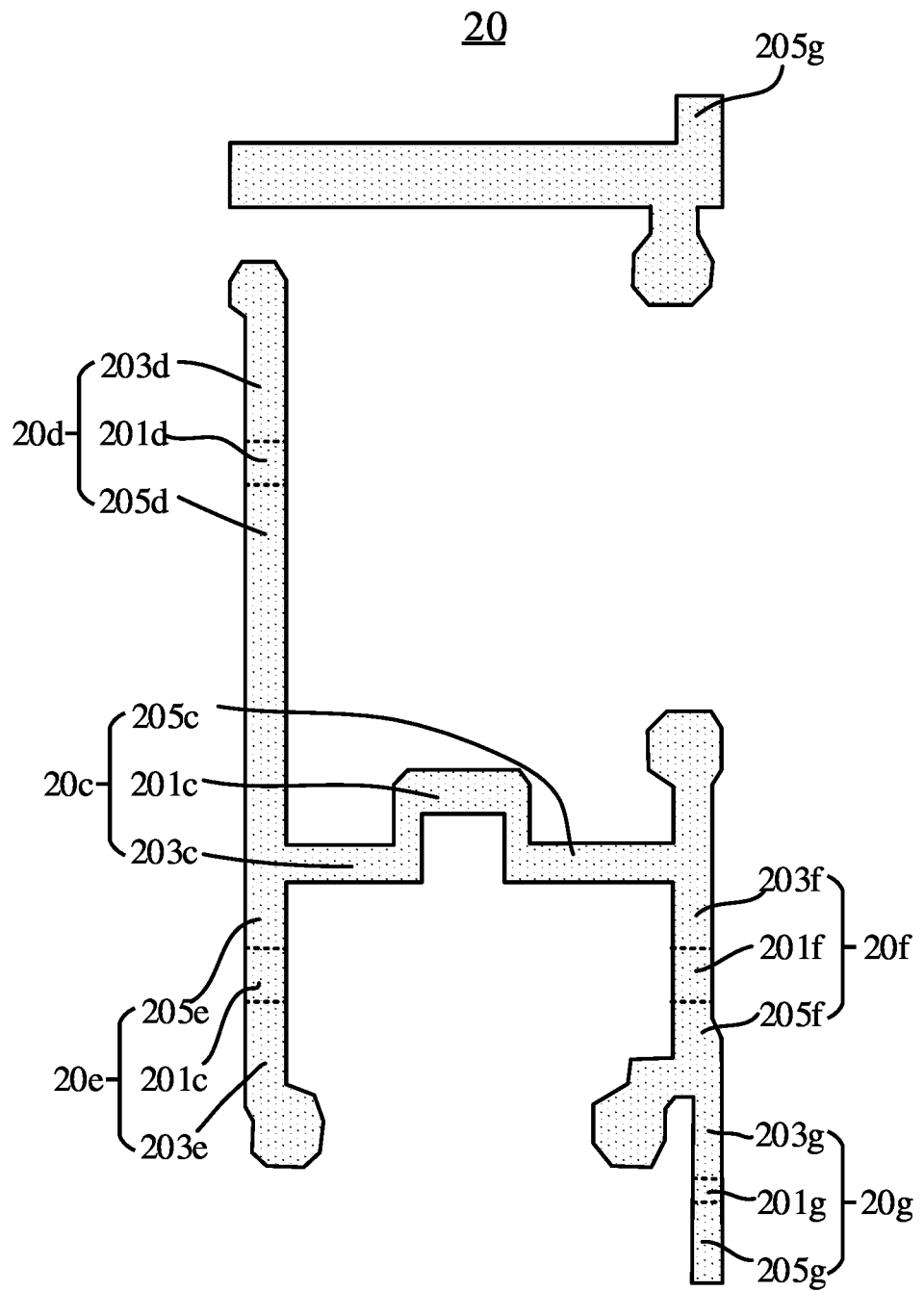
FIG. 6 shows a schematic diagram of a planar structure of a first semiconductor layer of the pixel driving circuit shown in FIG. 5.
Figure 7:
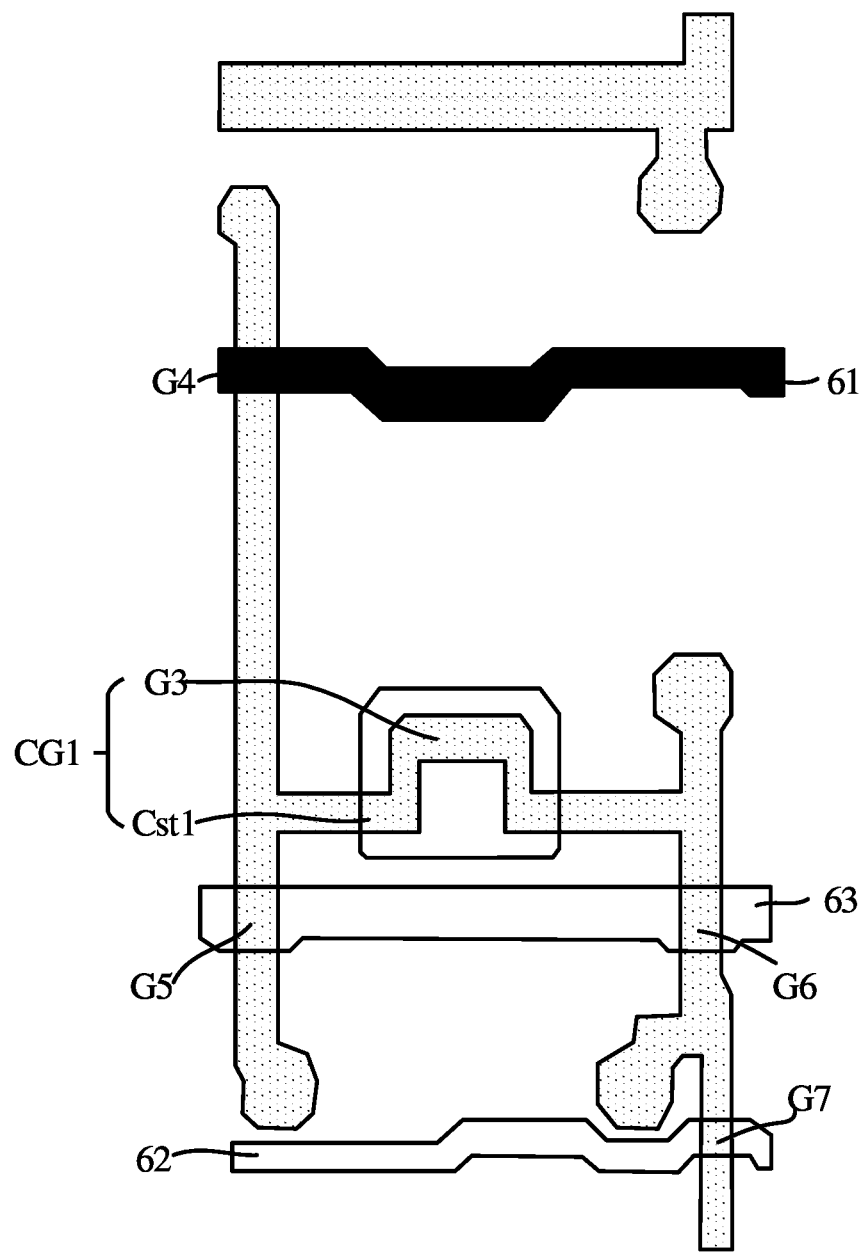
FIG. 7 shows a schematic diagram of a planar structure of a combination of the first semiconductor layer and a first conductive layer of the pixel driving circuit shown in FIG. 5.
Figure 8:
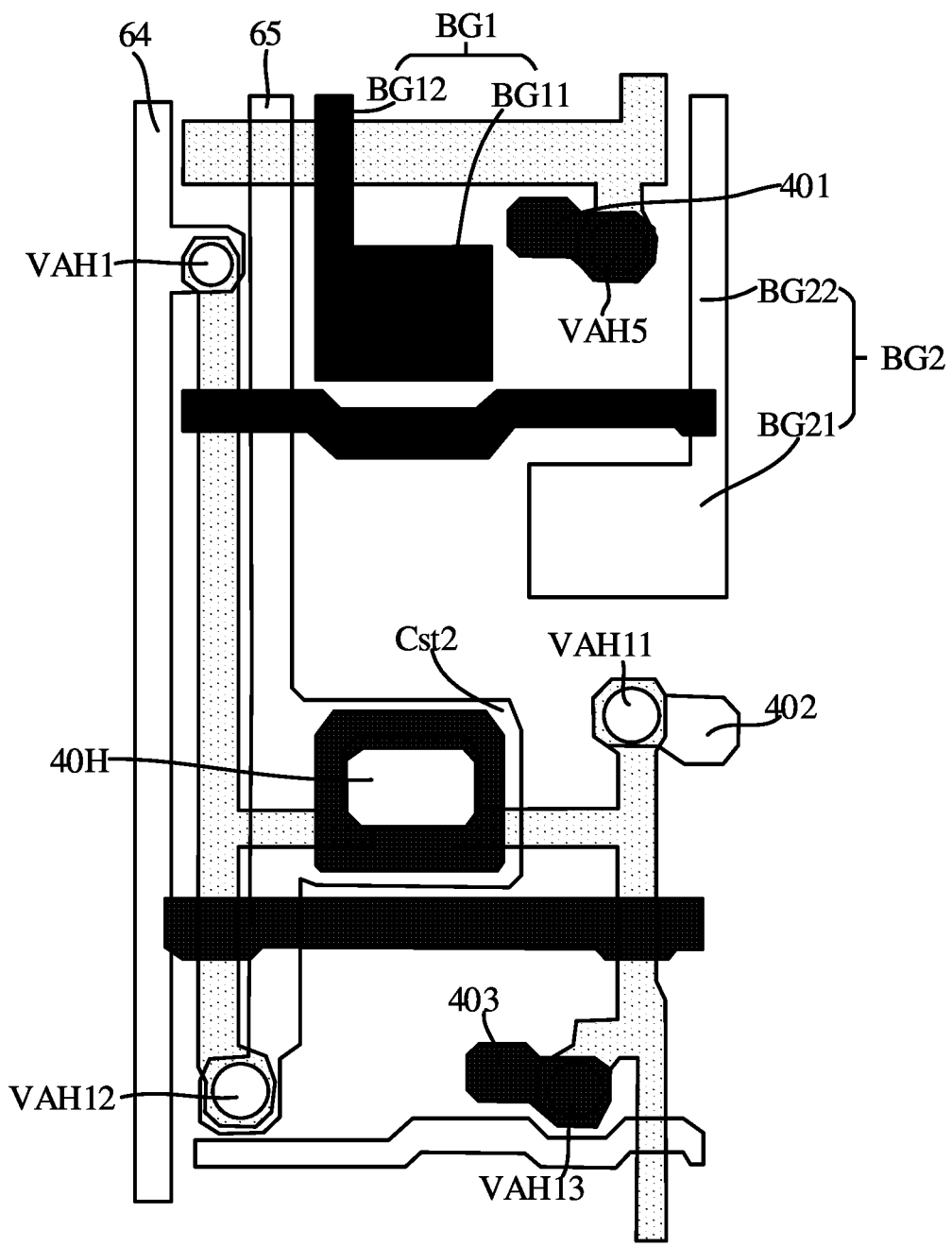
FIG. 8 shows a schematic diagram of a planar structure of a combination of the first semiconductor layer, the first conductive layer and a second conductive layer of the pixel driving circuit shown in FIG. 5.
Figure 9:
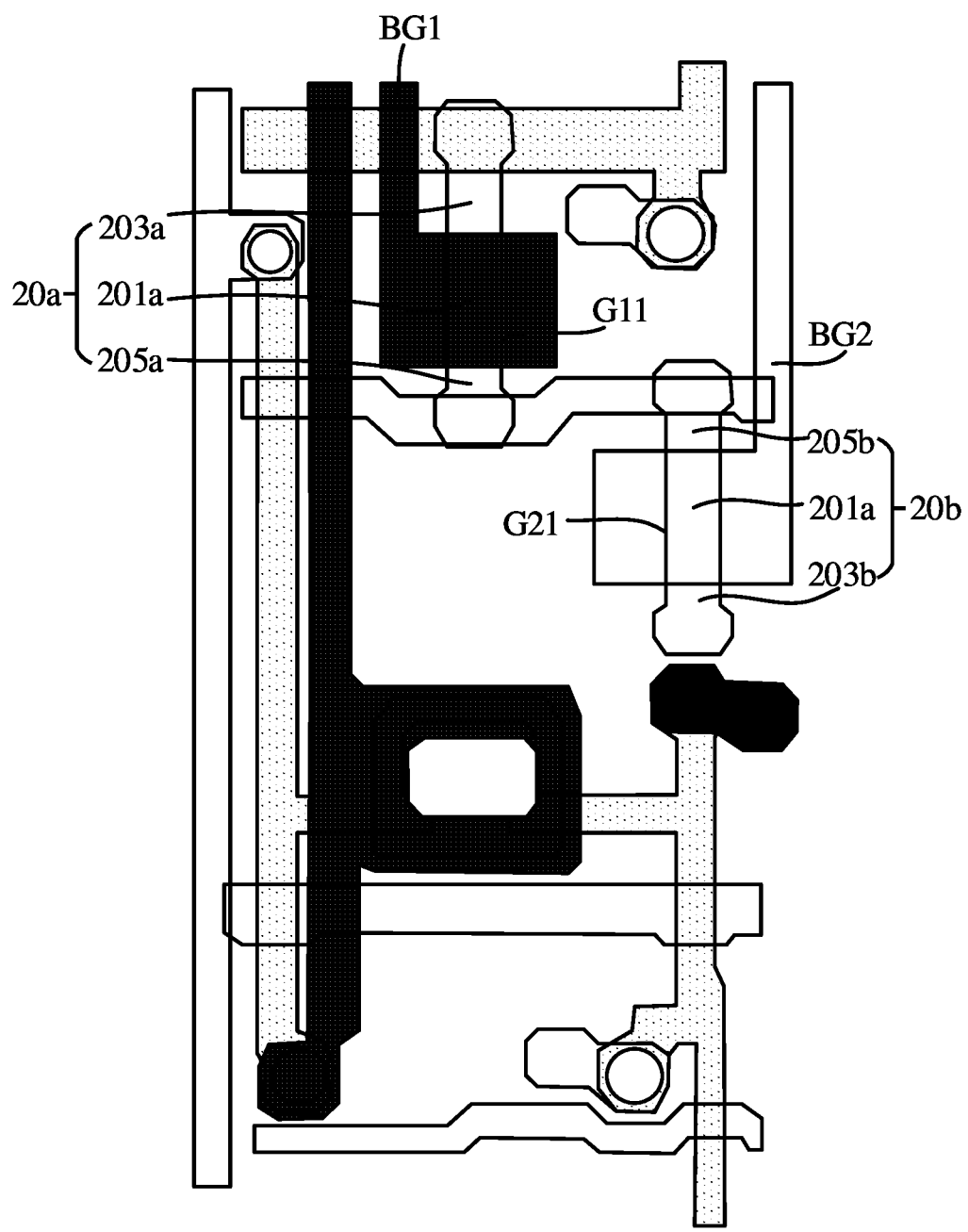
FIG. 9 shows a schematic diagram of a planar structure of a combination of the first semiconductor layer, the first conductive layer, the second conductive layer and a second semiconductor layer of the pixel driving circuit shown in FIG. 5.
Figure 10:
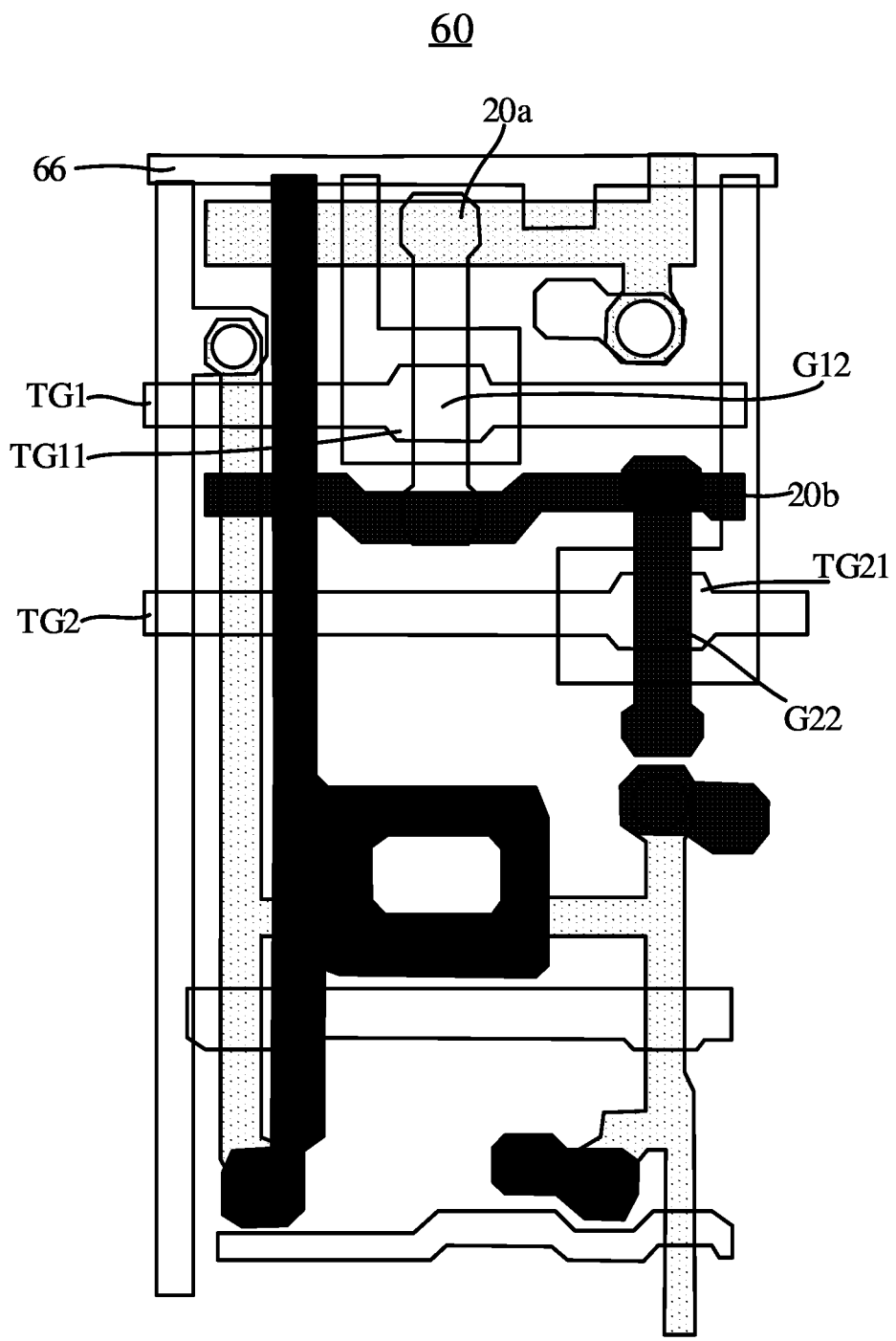
FIG. 10 shows a schematic diagram of a planar structure of a combination of the first semiconductor layer, the first conductive layer, the second conductive layer, the second semiconductor layer and a third conductive layer of the pixel driving circuit shown in FIG. 5.
Figure 11:
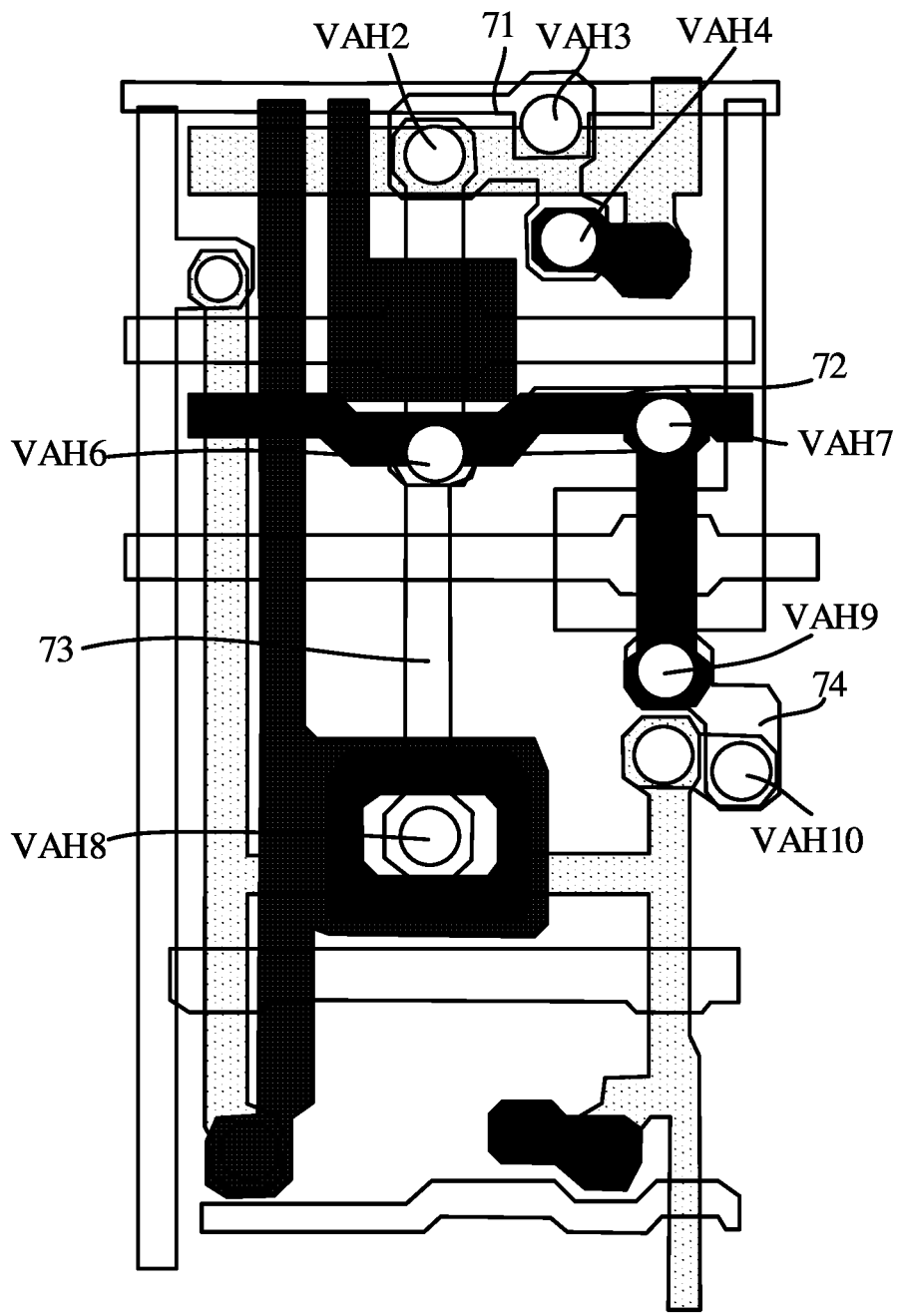
FIG. 11 shows a schematic diagram of a planar structure of a combination of the first semiconductor layer, the first conductive layer, the second conductive layer, the second semiconductor layer, the third conductive layer and a fourth conductive layer of the pixel driving circuit shown in FIG. 5.
Figure 12:
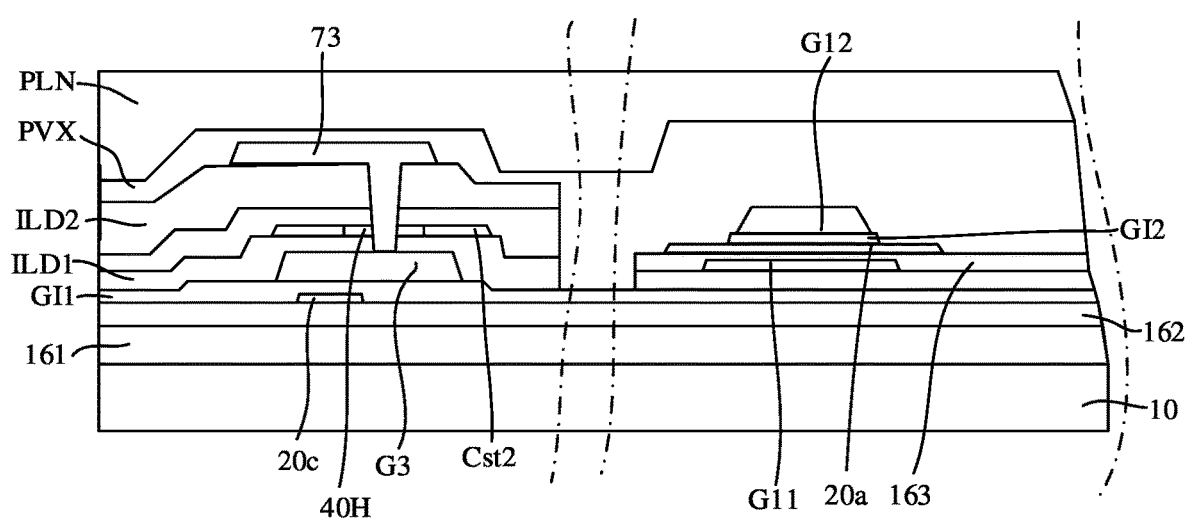
FIG. 12 shows a schematic diagram of cross-sectional structures of the display substrate according to some exemplary embodiments of the present disclosure taken along line AA' and line BB' in FIG. 5, where the cross-sectional structures taken along line AA' and line BB' in FIG. 5 are shown in the same schematic diagram for ease of description.

FIG. 5 shows a schematic diagram of a planar structure of a pixel driving circuit of a sub-pixel of a display substrate according to some exemplary embodiments of the present disclosure. FIG. 6 shows a schematic diagram of a planar structure of a first semiconductor layer of the pixel driving circuit shown in FIG. 5. FIG. 7 shows a schematic diagram of a planar structure of a combination of the first semiconductor layer and a first conductive layer of the pixel driving circuit shown in FIG. 5. FIG. 8 shows a schematic diagram of a planar structure of a combination of the first semiconductor layer, the first conductive layer and a second conductive layer of the pixel driving circuit shown in FIG. 5. FIG. 9 shows a schematic diagram of a planar structure of a combination of the first semiconductor layer, the first conductive layer, the second conductive layer and a second semiconductor layer of the pixel driving circuit shown in FIG. 5. FIG. 10 shows a schematic diagram of a planar structure of a combination of the first semiconductor layer, the first conductive layer, the second conductive layer, the second semiconductor layer and a third conductive layer of the pixel driving circuit shown in FIG. 5. FIG. 11 shows a schematic diagram of a planar structure of a combination of the first semiconductor layer, the first conductive layer, the second conductive layer, the second semiconductor layer, the third conductive layer and a fourth conductive layer of the pixel driving circuit shown in FIG. 5. FIG. 12 shows a schematic diagram of cross-sectional structures of the display substrate according to some exemplary embodiments of the present disclosure taken along line AA' and line BB' in FIG. 5, where the cross-sectional structures taken along line AA' and line BB' in FIG. 5 are shown in the same schematic diagram for case of description.

Referring to FIG. 5 to FIG. 12 in combination, the display substrate includes a base substrate 10 and a plurality of film layers arranged on the base substrate 10. In some embodiments, the plurality of film layers shown include at least a first semiconductor layer 20, a first conductive layer 30, a second conductive layer 40, a second semiconductor layer 50, a third conductive layer 60, and a fourth conductive layer 70 that are arranged sequentially away from the base substrate 10.

For example, the first semiconductor layer 20 may be formed of a semiconductor material such as low-temperature polysilicon, and may have a thickness of 400~800 angstroms (for example, 500 angstroms). The second semiconductor layer 50 may be formed of an oxide semiconductor material (for example, a polycrystalline oxide semiconductor material such as IGZO), and may have a thickness of 300~600 angstroms (for example, 400 angstroms). The first conductive layer 30 may be formed of a conductive material that forms the gate electrode of the thin film transistor (for example, Mo), and may have a thickness of 2000~3000 angstroms (for example, 2500 angstroms). The second conductive layer 40 may be formed of a conductive material that forms the source electrode and the drain electrode of the thin film transistor and that may contain Ti, Al, etc., for example. The second conductive layer 40 may have a stacked structure formed of Ti/Al/Ti, and have a thickness of 7000~9000 angstroms. For example, in a case where the second conductive layer 40 has the stacked structure formed of Ti/Al/Ti, Ti/Al/Ti layers may have a thickness of about 500 angstroms, 5500 angstroms and 500 angstroms, respectively. The third conductive layer 60 may be formed of a conductive material that forms the gate electrode of the thin film transistor (for example, Mo), and have a thickness of 2000~3000 angstroms (for example, 2500 angstroms). The fourth conductive layer 70 may be formed of a conductive material that forms the source electrode and the drain electrode of the thin film transistor and that may contain Ti, Al, etc., for example. The fourth conductive layer 70 may have a stacked structure formed of Ti/Al/Ti, and have a thickness of 7000~9000 angstroms. For example, in a case where the fourth conductive layer 70 has the stacked structure formed of Ti/Al/Ti, Ti/Al/Ti layers may have a thickness of about 500 angstroms, 5500 angstroms and 300 angstroms, respectively.

The display substrate includes a scan signal line 61, a reset signal line 62, a light emission control line 63 and an initialization voltage line 66 arranged in the row direction so as to respectively apply a scan signal Sn, a reset control signal RESET, a light emission control signal En and an initialization voltage Vint to the sub-pixels. The display substrate may further include a data line 64 and a driving voltage line 65 that cross the scan signal line 61, the reset signal line 62, the light emission control line 63 and the initialization voltage line 66 so as to respectively apply a data signal Dm and a driving voltage VDD to the sub-pixels.

In conjunction with the above description of FIG. 4, the pixel driving circuit of the display substrate may include a first transistor T1, a second transistor T2, a third transistor T3, a fourth transistor T4, a fifth transistor T5, a sixth transistor T6, a seventh transistor T7, and a storage capacitor Cst.

The first transistor T1 and the second transistor T2 may be formed along the second semiconductor layer as shown in FIG. 9. The third transistor T3, the fourth transistor T4, the fifth transistor T5, the sixth transistor T6 and the seventh transistor T7 may be formed along the first semiconductor layer 20 as shown in FIG. 6.

As shown in FIG. 6, the first semiconductor layer 20 may have a curved or bent shape, and may include a third active layer 20c corresponding to the third transistor T3, a fourth active layer 20d corresponding to the fourth transistor T4, a fifth active layer 20e corresponding to the fifth transistor T5, a sixth active layer 20f corresponding to the sixth transistor T6 and a seventh active layer 20g corresponding to the seventh transistor T7.

For example, the first semiconductor layer 20 may contain polysilicon, such as a low temperature polysilicon material. Each of the active layers of the transistors may include a channel region, a source region and a drain region. The channel region may be non-doped or have a doping type different from that of the source region and the drain region, and therefore has semiconductor characteristics. The source region and the drain region are respectively located on both sides of the channel region, and are doped with impurities, and therefore have conductivity. The impurities may vary depending on whether the TFT is an N-type or P-type transistor.

The third transistor T3 includes the third active layer 20c and a third gate electrode G3. The third active layer 20c includes a third source region 203c, a third drain region 205c, and a third channel region 201c connecting the third source region 203c and the third drain region 205c. The third source region 203c and the third drain region 205c extend in two opposite directions with respect to the third channel region 201c.

The fourth transistor T4 includes the fourth active layer 20d and a fourth gate electrode G4. The fourth active layer 20d includes a fourth source region 203d, a fourth drain region 205d, and a fourth channel region 201d connecting the fourth source region 203d and the fourth drain region 205d. The fourth source region 203d and the fourth drain region 205d extend in two opposite directions with respect to the fourth channel region 201d.

The fifth transistor T5 includes the fifth active layer 20e and a fifth gate electrode G5. The fifth active layer 20e includes a fifth source region 203e, a fifth drain region 205e, and a fifth channel region 201e connecting the fifth source region 203e and the fifth drain region 205c. The fifth source region 203e and the fifth drain region 205e extend in two opposite directions with respect to the fifth channel region 201c.

The sixth transistor T6 includes the sixth active layer 20f and a sixth gate electrode G6. The sixth active layer 20f includes a sixth source region 203f, a sixth drain region 205f, and a sixth channel region 201f connecting the sixth source region 203f and the sixth drain region 205f. The sixth source region 203f and the sixth drain region 205f extend in two opposite directions with respect to the sixth channel region 201f.

The seventh transistor T7 includes the seventh active layer 20g and a seventh gate electrode G7. The seventh active layer 20g includes a seventh source region 203g, a seventh drain region 205g, and a seventh channel region 201g connecting the seventh source region 203g and the seventh drain region 205g. The seventh source region 203g and the seventh drain region 205g extend in two opposite directions with respect to the seventh channel region 201g.

As shown in FIG. 7, the scan signal line 61, the reset signal line 62 and the light emission control line 63 are all located in the first conductive layer 30. A gate structure CGI is also located in the first conductive layer 30. A portion of the gate structure CGI that overlaps the first semiconductor layer 20 forms the third gate electrode G3 of the third transistor T3. A portion of the scan signal line 61 that overlaps the first semiconductor layer 20 forms the fourth gate electrode G4 of the fourth transistor T4. A portion of the light emission control line 63 that overlaps the first semiconductor layer 20 forms the fifth gate electrode G5 of the fifth transistor T5. Another portion of the light emission control line 63 that overlaps the first semiconductor layer 20 forms the sixth gate electrode G6 of the sixth transistor T6. A portion of the reset signal line 62 that overlaps the first semiconductor layer 20 forms the seventh gate electrode G7 of the seventh transistor T7. The gate structure CGI also forms one terminal of the storage capacitor Cst, such as the first capacitor electrode Cst1. That is, the gate structure CGI simultaneously serves as the gate electrode of the third transistor T3 and one electrode of the storage capacitor Cst.

As shown in FIG. 8, the data line 64 and the driving voltage line 65 are both located in the second conductive layer 40. A first bottom gate structure BG1 and a second bottom gate structure BG2 are also located in the second conductive layer 40. The data line 64 is electrically connected to the source region 203d of the fourth transistor T4 through a via hole VAH1 so as to apply the data signal Dm to the source electrode of the fourth transistor T4. That is, a portion of the data line 64 that overlaps the source region 203d of the fourth transistor T4 forms the source electrode of the fourth transistor T4. A portion of the second conductive layer 40 that overlaps the gate structure CGI forms another electrode of the storage capacitor Cst, for example, the second capacitor electrode Cst2. The second capacitor electrode Cst2 is electrically connected to the driving voltage line 65. For example, as shown in FIG. 8, the second capacitor electrode Cst2 is connected to the driving voltage line 65 as a whole. The driving voltage line 65 is electrically connected to the source region 203e of the fifth transistor T5 through a via hole VAH12. A portion of the driving voltage line 65 that overlaps the source region 203e of the fifth transistor T5 forms the source electrode of the fifth transistor T5.

With such a design, the first capacitor electrode Cst1 and the second capacitor electrode Cst2 have a large overlapping area, which may increase the capacitance value of the storage capacitor Cst, so that the performance of the display panel is improved, and the power consumption of the display panel is reduced.

Continuing to refer to FIG. 8, the second conductive layer 40 includes a through hole 40H that exposes a portion of the gate structure CGI, so as to facilitate the electrical connection between the third gate electrode G3 of the third transistor T3 and other components.

The second conductive layer 40 further includes a first conductive member 401, a second conductive member 402 and a third conductive member 403. The first conductive member 401 is electrically connected to the drain region 205g of the seventh transistor T7 through a via hole VAH5. The second conductive member 402 is electrically connected to the drain region 205c of the third transistor T3 through a via hole VAH11. The third conductive member 403 is electrically connected to the drain region 205f of the sixth transistor T6 and the source region 203g of the seventh transistor T7 through a via hole VAH13.

As shown in FIG. 9, the second semiconductor layer 50 includes a first active layer 20a corresponding to the first transistor T1 and a second active layer 20b corresponding to the second transistor T2. For example, the first active layer 20a of the first transistor T1 and the second active layer 20b of the second transistor T2 extend in the same direction as the data line, that is, both extend in an up-down direction shown.

For example, the second semiconductor layer 50 may contain an oxide semiconductor material, such as a low temperature polycrystalline oxide (LTPO) semiconductor material. Each of the active layers of the transistors may include a channel region, a source region and a drain region. The channel region may be non-doped or have a doping type different from that of the source region and the drain region, and therefore has semiconductor characteristics. The source region and the drain region are respectively located on both sides of the channel region, and are doped with impurities, and therefore have conductivity. The impurities may vary depending on whether the TFT is an N-type or P-type transistor.

The first active layer 20a of the first transistor T1 includes a first source region 203a, a first drain region 205a, and a first channel region 201a connecting the first source region 203a and the first drain region 205a. The first source region 203a and the first drain region 205a extend in two opposite directions with respect to the first channel region 201a.

The second active layer 20b of the second transistor T2 includes a second source region 203b, a second drain region 205b, and a second channel region 201b connecting the second source region 203b and the second drain region 205b. The second source region 203b and the second drain region 205b extend in two opposite directions with respect to the second channel region 201b.

An orthographic projection of the first active layer 20a on the base substrate 10 at least partially overlaps an orthographic projection of the first bottom gate structure BG1 on the base substrate 10, and a portion of the first bottom gate structure BG1 that overlaps the first active layer 20a forms a first bottom gate electrode G11 of the first transistor T1.

An orthographic projection of the second active layer 20b on the base substrate 10 at least partially overlaps an orthographic projection of the second bottom gate structure BG2 on the base substrate 10, and a portion of the second bottom gate structure BG2 that overlaps the second active layer 20b forms a second bottom gate electrode G21 of the second transistor T2.

For example, continuing to refer to FIG. 8 and FIG. 9, the first bottom gate structure BG1 includes a first bottom gate body portion BG11 and a first bottom gate extension portion BG12. An orthographic projection of the first bottom gate body portion BG11 on the base substrate 10 is rectangular. The orthographic projection of the first bottom gate body portion BG11 on the base substrate 10 at least partially overlaps the orthographic projection of the active layer of the first transistor T1 on the base substrate 10, and the first bottom gate electrode G11 includes a portion of the first bottom gate body portion BG1l that overlaps the active layer of the first transistor T1.

The second bottom gate structure BG2 includes a second bottom gate body portion BG21 and a second bottom gate extension portion BG22. An orthographic projection of the second bottom gate body portion BG21 on the base substrate 10 is rectangular. The orthographic projection of the second bottom gate body portion BG21 on the base substrate 10 at least partially overlaps the orthographic projection of the active layer of the second transistor T2 on the base substrate 10, and the second bottom gate electrode G21 includes a portion of the second bottom gate body portion BG21 that overlaps the active layer of the second transistor T2.

In the embodiments shown, at least one of the first bottom gate extension portion BG12 and the second bottom gate extension portion BG22 extends in the same direction as the data line, that is, both extend in an up-down direction shown.

As shown in FIG. 10, the third conductive layer 60 includes a first top gate structure TG1 and a second top gate structure TG2. The initialization voltage line 66 is also located in the third conductive layer 60.

The orthographic projection of the first active layer 20a on the base substrate 10 at least partially overlaps an orthographic projection of the first top gate structure TG1 on the base substrate 10, and the orthographic projection of the first bottom gate structure BG1 on the base substrate 10 at least partially overlaps the orthographic projection of the first top gate structure TG1 on the base substrate 10. A portion of the first top gate structure TG1 that overlaps the first active layer 20a forms a first top gate electrode G12 of the first transistor. Referring to FIG. 12 in combination, in a direction perpendicular to an upper surface of the base substrate 10 (that is, in a vertical direction shown in FIG. 12), the first active layer 20a is located between the first bottom gate electrode G11 and the first top gate electrode G12. In this way, the first transistor T1 has a dual-gate structure.

Continuing to refer to FIG. 10, the first top gate structure TG1 extends in a horizontal direction shown in FIG. 10. The first top gate structure TG1 may include a first widened portion TG11, and a size of the first widened portion TG11 in the vertical direction is larger than that of a remaining portion of the first top gate structure TG1 in the vertical direction. An orthographic projection of the first widened portion TG11 on the base substrate 10 at least partially overlaps the orthographic projection of the active layer 20a of the first transistor T1 on the base substrate 10, and the first top gate electrode G12 includes a portion of the first widened portion TG11 that overlaps the active layer 20a of the first transistor T1.

In the embodiments shown in FIG. 10, the first widened portion TG11 protrudes to both sides with respect to the remaining portion of the first top gate structure TG1 in the first direction (that is, the vertical direction shown in FIG. 1). Optionally, the first widened portion TG11 may only protrude to one side with respect to the remaining portion of the first top gate structure TG1 in the first direction (that is, the vertical direction shown in FIG. 10). For example, it may only protrude upward or downward.

The orthographic projection of the second active layer 20b on the base substrate 10 at least partially overlaps an orthographic projection of the second top gate structure TG2 on the base substrate 10, and the orthographic projection of the second bottom gate structure BG2 on the base substrate 10 at least partially overlaps the orthographic projection of the second top gate structure TG2 on the base substrate 10. A portion of the second top gate structure TG2 that overlaps the second active layer 20b forms a second top gate electrode G22 of the second transistor. Referring to FIG. 12 in combination, in a direction perpendicular to the upper surface of the base substrate 10 (that is, in the vertical direction shown in FIG. 12), the second active layer 20b is located between the second bottom gate electrode G21 and the second top gate electrode G22. In this way, the second transistor T2 has a dual-gate structure.

Continuing to refer to FIG. 10, the second top gate structure TG2 extends in the horizontal direction shown in FIG. 10. The second top gate structure TG2 may include a second widened portion TG21, and a size of the second widened portion TG21 in the vertical direction is larger than that of a remaining portion of the second top gate structure TG2 in the vertical direction. An orthographic projection of the second widened portion TG21 on the base substrate 10 at least partially overlaps the orthographic projection of the active layer 20b of the second transistor T2 on the base substrate, and the second top gate electrode G22 includes a portion of the second widened portion TG21 that overlaps the active layer 20b of the second transistor T2.

In the embodiments shown in FIG. 10, the second widened portion TG21 protrudes to both sides with respect to the remaining portion of the second top gate structure TG2 in the first direction (that is, the vertical direction shown in FIG. 10). Optionally, the second widened portion TG21 may only protrude to one side with respect to the remaining portion of the second top gate structure TG2 in the first direction (that is, the vertical direction shown in FIG. 10). For example, it may only protrude upward or downward.

As shown in FIG. 11, the fourth conductive layer 70 includes a first conductive component 701, a second conductive component 702, a third conductive component 703, and a fourth conductive component 704. The first conductive component 701 has one end electrically connected to the source region 203a of the first transistor T1 through the via hole VAH2, and the other end electrically connected to the first conductive member 401 through the via hole VAH4. A portion of the first conductive component 701 is further electrically connected to the initialization voltage line 66 through the via hole VAH3. In this way, the source electrode of the first transistor T1 and the drain electrode of the seventh transistor T7 are electrically connected to each other, and both are electrically connected to the initialization voltage line 66. In this way, the initialization voltage Vint may be applied to the source electrode of the first transistor T1 and the drain electrode of the seventh transistor T7.

The second conductive component 702 has one end electrically connected to the drain region 205b of the second transistor T2 through the via hole VAH7, and the other end electrically connected to the drain region 203a of the first transistor T1 and the third conductive component 703 through the via hole VAH6. The third conductive component 703 has one end electrically connected to the second conductive component 702 through the via hole VAH6, and the other end electrically connected to the gate electrode G1 of the third transistor T3 and the first capacitor electrode Cst1 through the via hole VAH8. In this way, the drain electrode of the first transistor T1, the drain electrode of the second transistor T2, the gate electrode of the third transistor T3 and the first capacitor electrode Cst1 may be electrically connected to one another, and referring to FIG. 4, they are all electrically connected at the node N1.

The fourth conductive component 704 has one end electrically connected to the source region 203b of the second transistor T2 through the via hole VAH9, and the other end electrically connected to the second conductive member 402 through the via hole VAH10. In this way, the source electrode of the second transistor T2 may be electrically connected to the source electrode of the sixth transistor T6.

In the embodiments of the present disclosure, the active layers of the first transistor T1 and the second transistor T2 are both formed of an oxide semiconductor material such as LTPO, which may improve a voltage stability at the node 1 in the pixel driving circuit (as shown in FIG. 4), so that the display performance of the display panel is improved. In addition, both the first transistor T1 and the second transistor T2 have a dual-gate structure, which improves the stability of the first transistor T1 and the second transistor T2 as well as the uniformity of the threshold voltage (Vth), so that the performance of the display panel is further improved.

It should also be noted that in the embodiments of the present disclosure, the bottom gate electrodes G11, G21 of the transistors T1, T2 not only function as bottom gate electrodes, but also as a light-shielding layer, which may avoid external light interference to the active layers 20a, 20b of the transistors T1, T2, so that the performance of the transistor is further improved. The bottom gate electrodes G11, G21 of the transistors T1, T2 as well as the source and drain electrodes of the transistors T3, T4, T5, T6, T7 are located in the same layer (that is, in the second conductive layer 40), and may be formed by the same patterning process, which is beneficial to save the number of patterning processes and reduce the number of masks.

Figure 13:
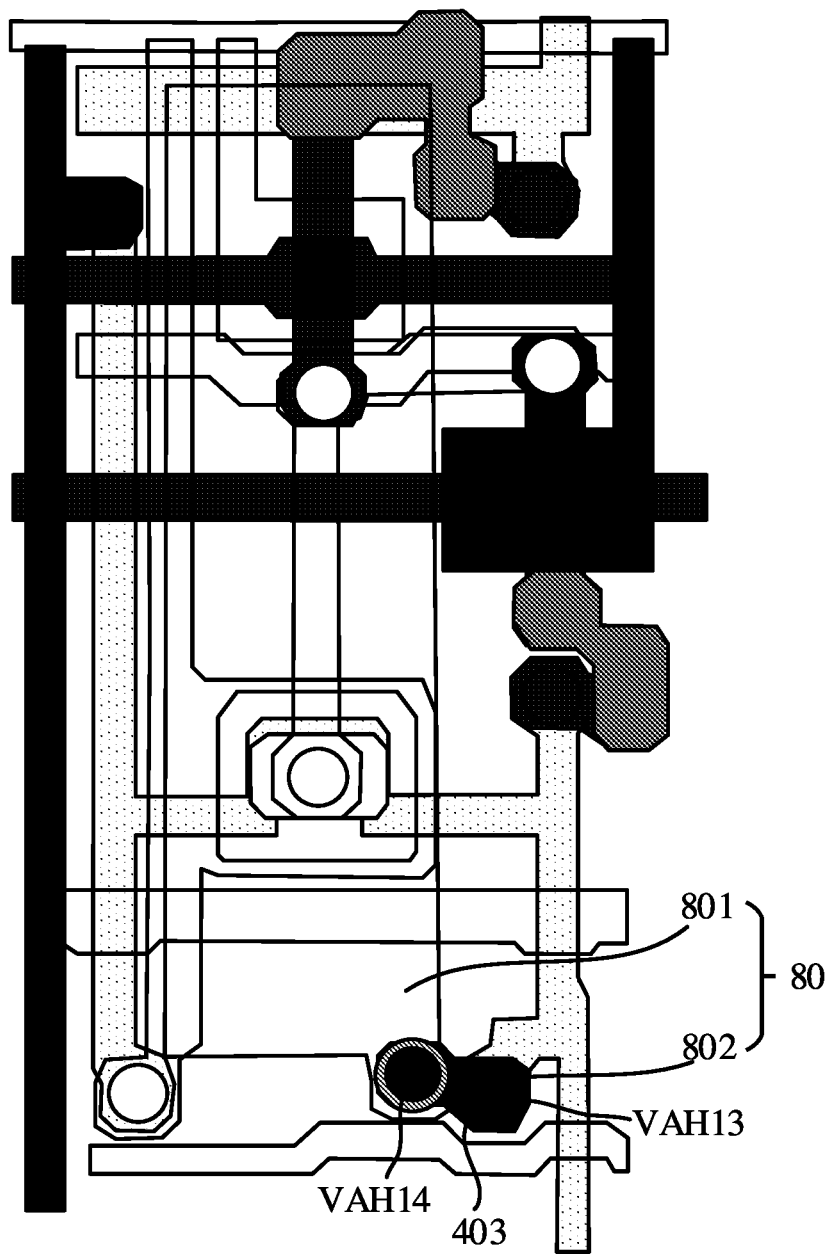
FIG. 13 shows a schematic diagram of a planar structure of a display substrate according to some exemplary embodiments of the present disclosure, where a planar structure of a first electrode of a light emitting device is schematically shown.
Figure 14:
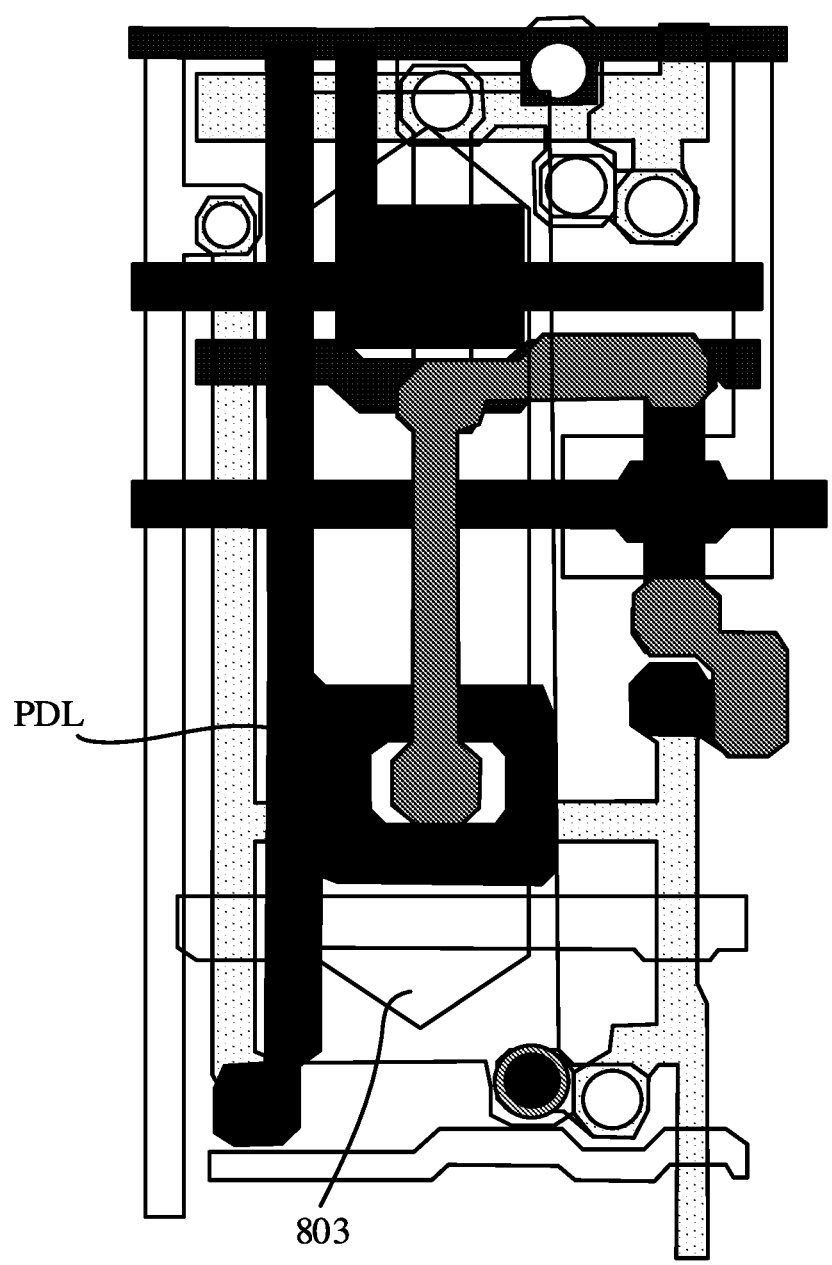
FIG. 14 shows a schematic diagram of a planar structure of a display substrate according to some exemplary embodiments of the present disclosure, where an opening of a pixel defining layer is schematically shown.
Figure 15:
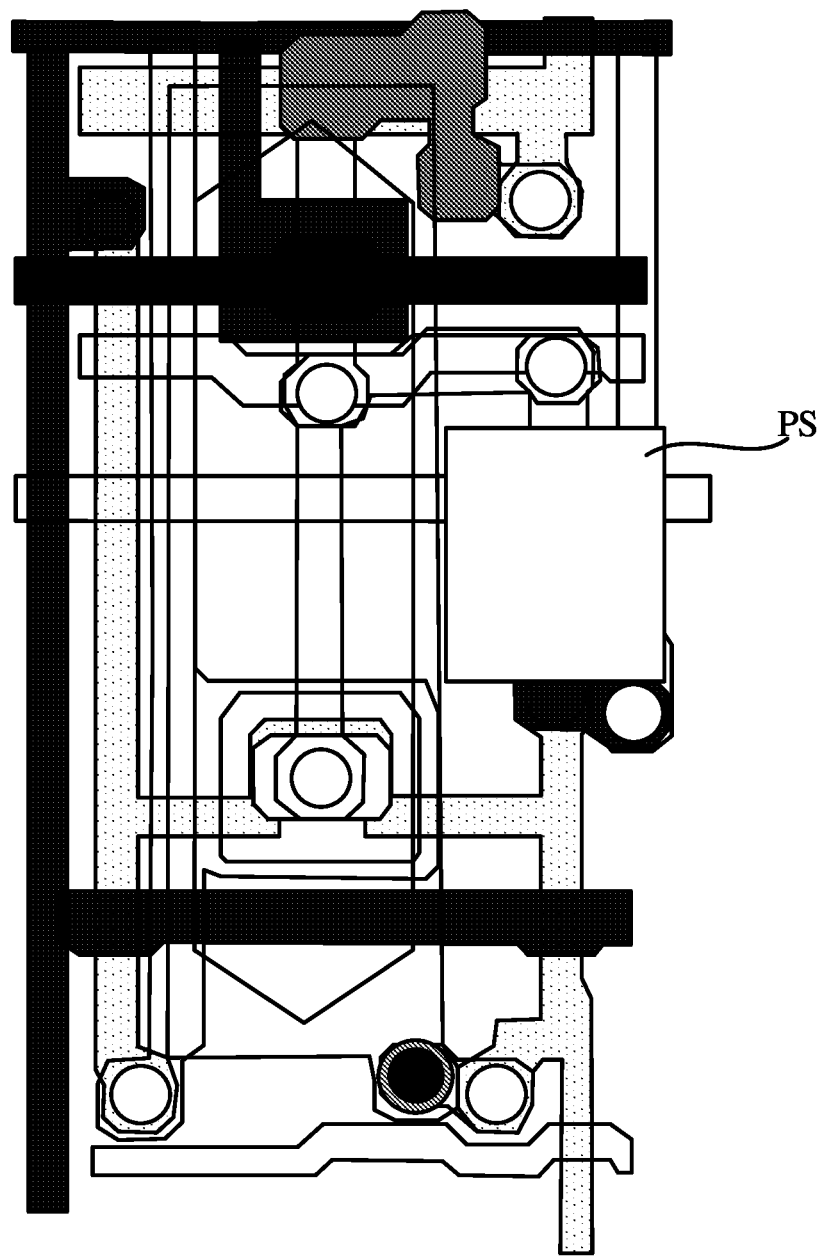
FIG. 15 shows a schematic diagram of a planar structure of a display substrate according to some exemplary embodiments of the present disclosure, where a planar structure of a spacer is schematically shown.
Figure 16:
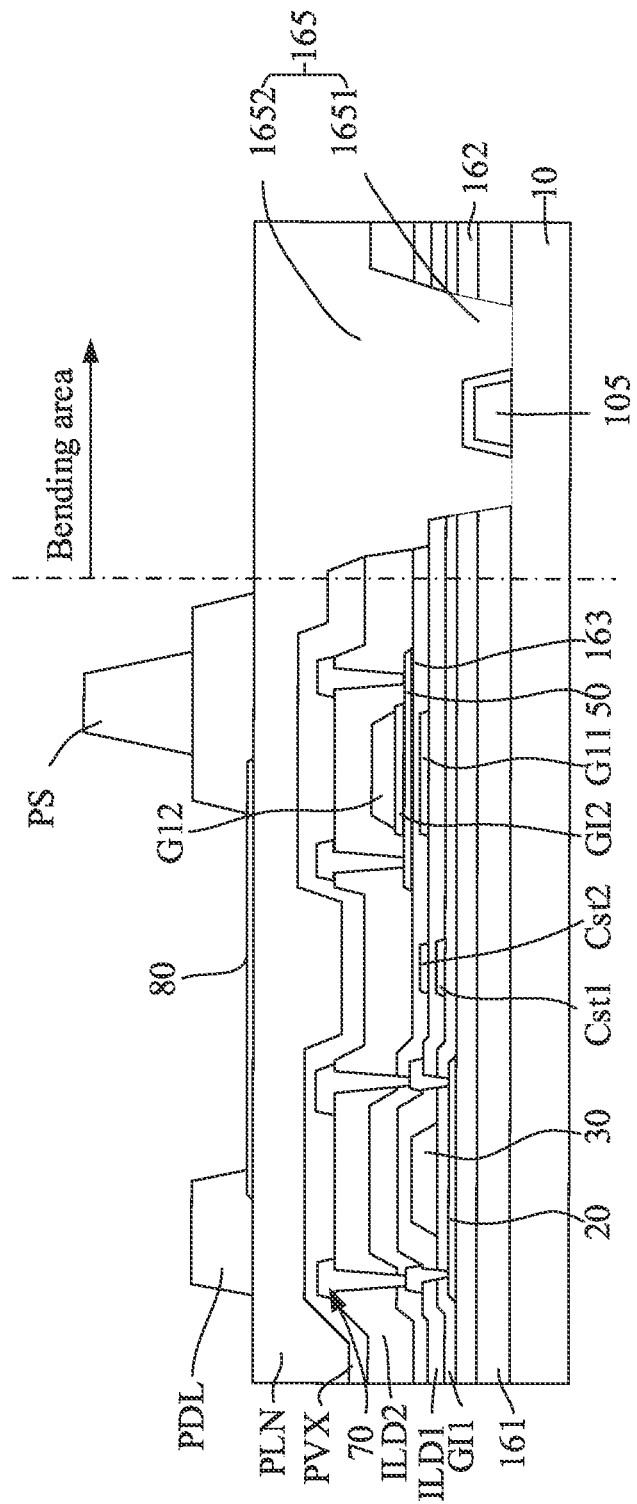
FIG. 16 shows a schematic diagram of a cross-sectional structure of a display substrate according to some exemplary embodiments of the present disclosure.

FIG. 13 shows a schematic diagram of a planar structure of a display substrate according to some exemplary embodiments of the present disclosure, where a planar structure of a first electrode of a light emitting device is schematically shown. FIG. 14 shows a schematic diagram of a planar structure of a display substrate according to some exemplary embodiments of the present disclosure, where an opening of a pixel defining layer is schematically shown. FIG. 15 shows a schematic diagram of a planar structure of a display substrate according to some exemplary embodiments of the present disclosure, where a planar structure of a spacer is schematically shown. FIG. 16 shows a schematic diagram of a cross-sectional structure of a display substrate according to some exemplary embodiments of the present disclosure.

For example, the light emitting device may be an organic light emitting diode, which may include a first electrode, an organic light emitting layer and a second electrode arranged on the base substrate 10. The first electrode may be one of the anode and the cathode, and the second electrode may be the other of the anode and the cathode. The first electrode, the organic light emitting layer and the second electrode may be arranged away from the base substrate 10 in this order.

As shown in FIG. 13, the first electrode 80 may include an electrode body portion 801 and an electrode connecting portion 802. In the embodiments shown in FIG. 13, the electrode body portion 801 may have a substantially rectangular shape. That is, an orthographic projection of the electrode body portion 801 on the base substrate 10 is substantially rectangular. However, the embodiments of the present disclosure are not limited thereto. The electrode body portion 801 may have any suitable shape, for example, a hexagonal shape, an octagonal shape, and the like.

The electrode body portion 801 and the electrode connecting portion 802 may be connected as a whole. The electrode connecting portion 802 is electrically connected to one end of the third conductive member 403 through the via hole VAH14. As described above, the other end of the third conductive member 403 is electrically connected to the drain electrode of the sixth transistor T6 and the source electrode of the seventh transistor T7 through the via hole VAH13. In this way, the first electrode 80 is electrically connected to the drain electrode of the sixth transistor T6 and the source electrode of the seventh transistor T7.

For example, the orthographic projection of the first electrode 80 on the base substrate 10 at least covers the orthographic projection of the active layer 20a of the first transistor T1 on the base substrate 10. The orthographic projection of the first electrode 80 on the base substrate 10 is spaced from the orthographic projection of the active layer 20b of the second transistor T2 on the base substrate 10.

Referring to FIG. 14 and FIG. 16 in combination, the display substrate further includes a pixel defining layer PDL arranged on a side of the first electrode 80 away from the base substrate 10. The pixel defining layer PDL includes an opening 803 that exposes at least portion of the first electrode 80. For example, in the embodiments shown in FIG. 14, the opening 803 has a hexagonal shape. That is, an orthographic projection of the opening 803 on the base substrate 10 has a hexagonal shape. However, the embodiments of the present disclosure are not limited thereto. The opening 803 may have any suitable shape, for example, a rectangular shape, an octagonal shape, and the like.

Referring to FIG. 15 and FIG. 16 in combination, the display substrate further includes a spacer PS arranged on a side of the pixel defining layer PDL away from the base substrate 10. For example, in the embodiments shown in FIG. 15, the spacer PS has a rectangular shape. That is, an orthographic projection of the spacer PS on the base substrate 10 has a rectangular shape. However, the embodiments of the present disclosure are not limited thereto. The spacer PS may have any suitable shape, for example, a circle or the like.

For example, the orthographic projection of the spacer PS on the base substrate 10 at least partially overlaps the orthographic projection of the active layer 20b of the second transistor T2 on the base substrate 10.

In some embodiments of the present disclosure, the display substrate may be a flexible display substrate.

Figure 17:
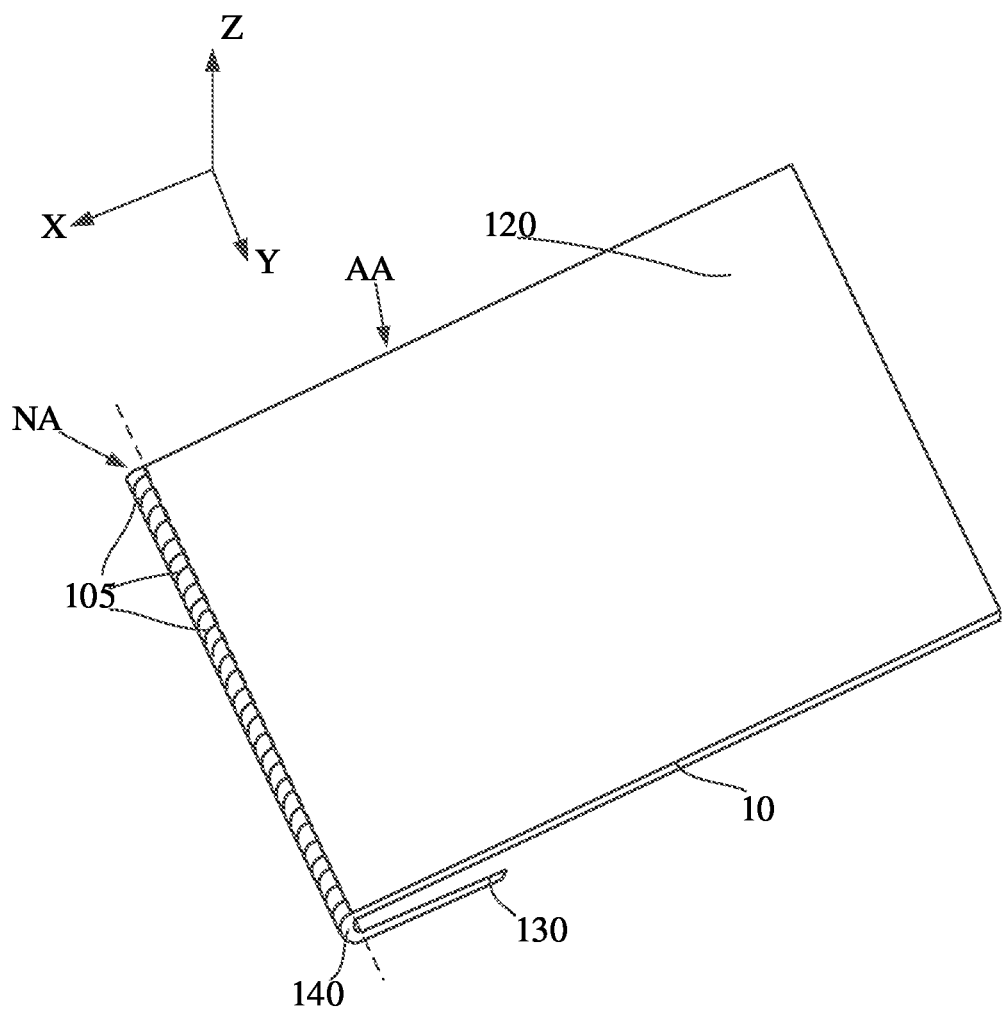
FIG. 17 shows a schematic diagram of a flexible display substrate in a folded state according to some exemplary embodiments of the present disclosure.
Figure 18:
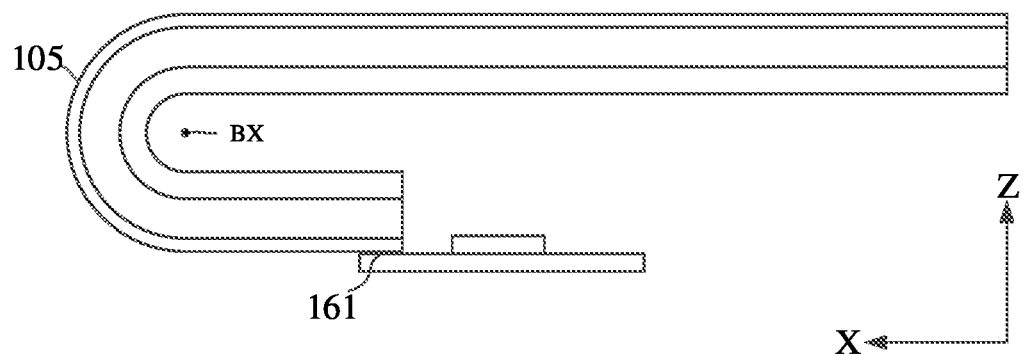
FIG. 18 shows a cross-sectional view of the flexible display substrate in FIG. 17 in X direction.

FIG. 17 shows a schematic diagram of a flexible display substrate in a folded state according to some exemplary embodiments of the present disclosure. FIG. 18 shows a cross-sectional view of the flexible display substrate in FIG. 17 in the X direction. Referring to FIG. 17 and FIG. 18 in combination, the flexible display substrate includes a display area (AA), a pad area 130, and a bending area 140 located between the display area and the pad area 130. The pad area 130 and the bending area 140 are both located in the non-display area (NA) outside the display area.

For example, in a case where the display substrate is a flexible display substrate, the base substrate 10 may be an organic flexible substrate formed of, for example, polyimide (PI), polyethylene terephthalate (PET), polycarbonate, polyethylene, polyacrylate, polyetherimide, polyethersulfone, etc.

For example, the base substrate 10 may include a first substrate, a second substrate, and a first barrier layer arranged between the first substrate and the second substrate. The first substrate may be formed of polyimide (PI) and have a thickness of about 10 microns. The first barrier layer may be formed of silicon oxide and have a thickness of about 6000 angstroms. Alternatively, the first barrier layer may be formed of amorphous silicon and have a thickness of about 40 angstroms. The second substrate may be formed of polyimide (PI) and have a thickness of about 6 microns.

The bending area 140 in FIG. 17 may be bent around a bending axis (BX). It should be noted that the "bending axis" herein is a virtual axis around which the bending area 140 may be bent, rather than a physical bending axis provided in the flexible display substrate.

For example, in order to facilitate wiring, the bending area 140 is arranged on a non-display area side of the flexible display substrate in the X direction. In this way, the gate driving circuit may be bound on the non-display area side of the flexible display substrate in the Y direction, or a GOA (Gate Driver On Array) circuit may be directly formed on the flexible base substrate. A wire 105 is provided in the bending area 140 for electrically connecting the GOA circuit to the pixel driving circuit described above. In the embodiments of the present disclosure, the wire 105 may be various conductive wires extending from the display area AA to the non-display area NA and used for transmitting electrical signals, such as a data line, a VSS power line, a VDD power line, and so on.

In the embodiments of the present disclosure, by providing the bending area, the pad area 130 may be bent to a back of the display area and overlap the display area, so that a narrow-frame or even frameless display device is realized.

Referring to FIG. 16 to FIG. 18 in combination, the display substrate includes a wire 105 provided in the bending area 140. The wire 105 may be located in the fourth conductive layer 70.

Hereinafter, other film layers (for example, the insulating layer) of the display substrate according to the embodiments of the present disclosure will be described with reference to FIG. 12 and FIG. 16.

In the exemplary embodiments, the display substrate may include a second barrier layer 161 arranged on the base substrate 10, and a first buffer layer 162 arranged on a side of the second barrier layer 161 away from the base substrate 10.

For example, the second barrier layer may be formed of silicon oxide and have a thickness of about 5500 angstroms. The first buffer layer may be formed of silicon nitride and have a thickness of about 1000 angstroms. Alternatively, the first buffer layer 162 may be formed of silicon oxide and have a thickness of about 3000 angstroms.

The display substrate may include a first gate insulating layer GI1 arranged between the first semiconductor layer 20 and the first conductive layer 30. For example, the first gate insulating layer GI1 may be formed of silicon oxide and have a thickness of about 1000~2000 angstroms.

The display substrate may include a first interlayer insulating layer ILD1 arranged between the first conductive layer 30 and the second conductive layer 40. For example, the first interlayer insulating layer ILD1 may be formed of silicon nitride and have a thickness of about 1000~2000 angstroms.

The display substrate may include a second buffer layer 163 arranged between the second conductive layer 40 and the second semiconductor layer 50. For example, the second buffer layer 163 may be formed of silicon oxide and have a thickness of about 3000~6000 angstroms.

The display substrate may include a second gate insulating layer GI2 arranged between the second semiconductor layer 50 and the third conductive layer 60. For example, the second gate insulating layer GI2 may be formed of silicon oxide and have a thickness of about 1300 angstroms.

The display substrate may include a second interlayer insulating layer ILD2 arranged between the third conductive layer 60 and the fourth conductive layer 70. For example, the second interlayer insulating layer ILD2 may be formed of silicon oxide and have a thickness of about 3000~6000 angstroms.

The display substrate may include a passivation layer PVX arranged on a side of the fourth conductive layer 70 away from the base substrate 10, and a planarization layer PLN arranged on a side of the passivation layer PVX away from the base substrate 10. For example, the passivation layer PVX may be formed of silicon oxide and have a thickness of about 2000~3500 angstroms. The planarization layer PLN may be formed of polyimide (PI) and have a thickness of about 1.5 microns.

As shown in FIG. 16, the display substrate includes a groove 165 located in the bending area 140. The groove 165 is a stepped groove, that is, it includes a first groove portion 1651 and a second groove portion 1652. An orthographic projection of the second groove portion 1652 on the base substrate 10 covers an orthographic projection of the first groove portion 1651 on the base substrate 10, and has an area larger than that of the orthographic projection of the first groove portion 1651 on the base substrate 10.

The first groove portion 1651 penetrates at least the first interlayer insulating layer ILD1, the first gate insulating layer GI1 and the first buffer layer 162 so as to expose a portion of the base substrate 10 in the bending area 140. The second groove portion 1652 penetrates at least the second buffer layer 163, the second gate insulating layer GI2, the second interlayer insulating layer ILD2 and the passivation layer PVX.

A portion of the planarization layer PLN is filled in the groove 165. In this way, the base substrate 10 and the planarization layer PLN are mainly formed in the bending area 140, which is beneficial to improve the bending performance of the display substrate in the bending area.

Referring to FIG. 16, the wire 105 is located at a bottom of the groove 165. In the embodiments of the present disclosure, a portion of the passivation layer PVX covers the wire 105 to protect the wire 105.

Figure 19:
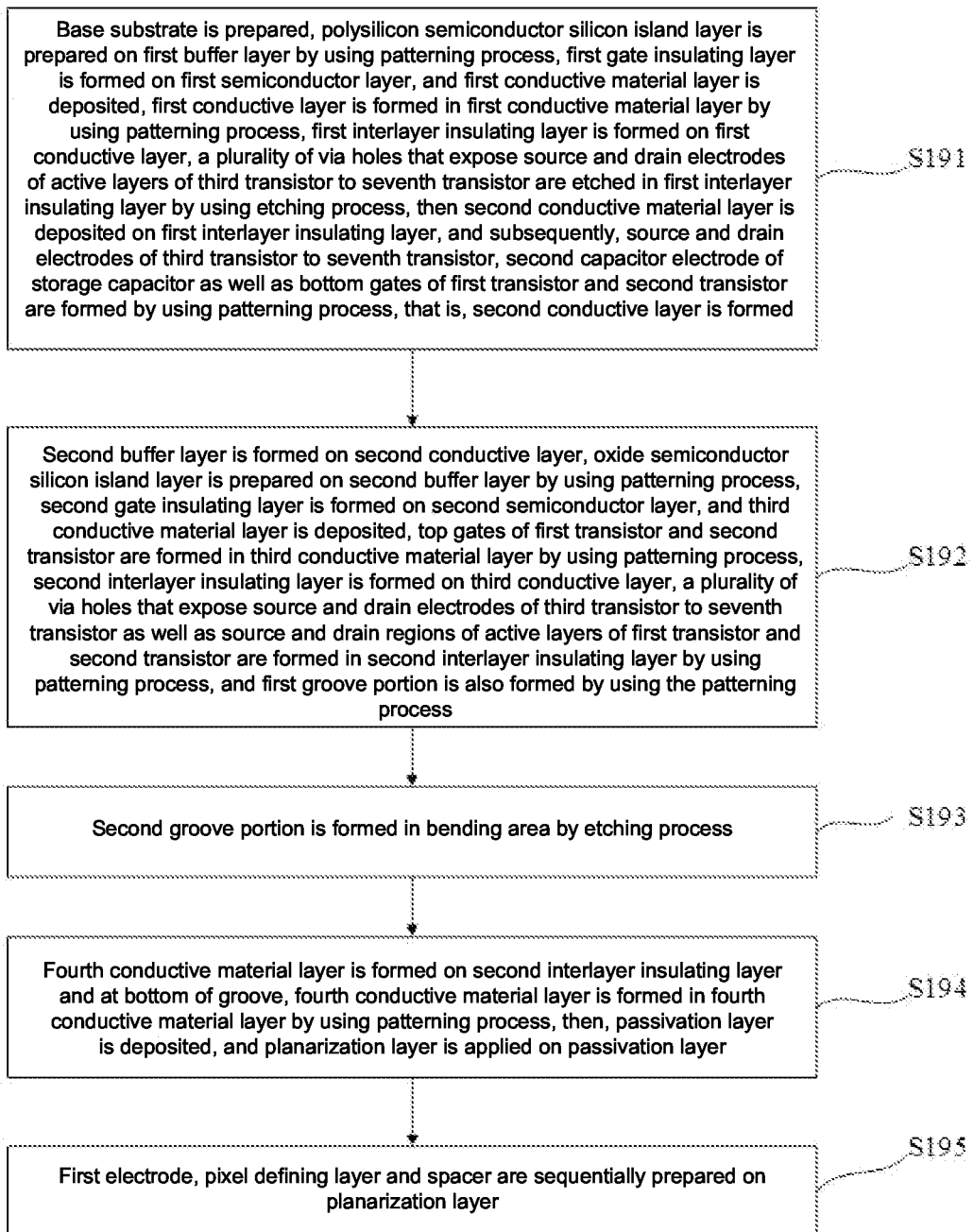
FIG. 19 shows a flowchart of a manufacturing method of a display substrate according to some exemplary embodiments of the present disclosure.

FIG. 19 shows a flowchart of a manufacturing method of a display substrate according to some exemplary embodiments of the present disclosure. FIG. 20 to FIG. 23 and FIG. 16 show schematic diagrams of cross-sectional structures of a display substrate formed after some steps in the manufacturing method shown in FIG. 19 are executed. Referring to FIG. 16 and FIG. 19 to FIG. 23 in combination, the manufacturing method of the display panel may be performed according to the following steps.

Figure 20:
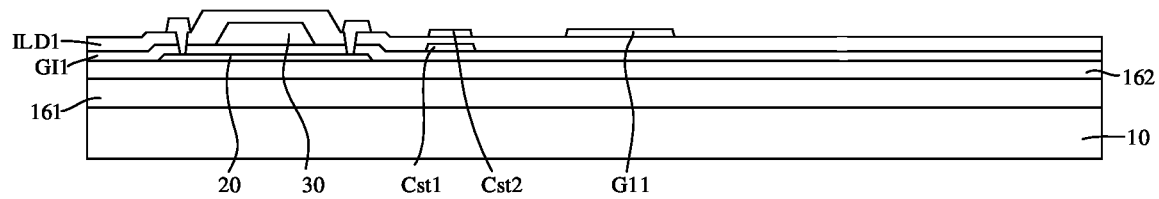
FIG. 20 to FIG. 23 show schematic diagrams of cross-sectional structures of a display substrate formed after some steps in the manufacturing method shown in FIG. 19 are executed.

Referring to FIG. 20, in step S191, the base substrate 10 is prepared. For example, the base substrate 10 may be an organic flexible substrate formed of, for example, polyimide (PI), polyethylene terephthalate (PET), polycarbonate, polyethylene, polyacrylate, polyetherimide, polyethersulfone, etc. The base substrate 10 may have a single-layer structure or a double-layer structure. For example, the base substrate 10 may include a first substrate, a second substrate, and a first barrier layer arranged between the first substrate and the second substrate. The base substrate 10 has a thickness of about 5~20 microns. The second barrier layer 161 and the first buffer layer 162 are sequentially prepared on the base substrate 10.

Then, a polysilicon semiconductor silicon island layer (that is, the first semiconductor layer 20) is prepared on the first buffer layer 162 by using a patterning process.

The first gate insulating layer GI1 is formed on the first semiconductor layer 20, and a first conductive material layer is deposited. The gate electrodes of the third transistor T3 to the seventh transistor T7 described above as well as the first capacitor electrode of the storage capacitor Cst are formed in the first conductive material layer by a patterning process, that is, the first conductive layer 30 described above is formed.

The first interlayer insulating layer ILD1 is formed on the first conductive layer 30. Then, a plurality of via holes that expose the source regions and the drain regions of the active layers of the third transistor T3 to the seventh transistor T7 are etched in the first interlayer insulating layer ILD1 by an etching process.

Next, a second conductive material layer is deposited on the first interlayer insulating layer ILD1. Then, the source and drain electrodes of the third transistor T3 to the seventh transistor T7, the second capacitor electrode of the storage capacitor Cst, and the bottom gate electrodes of the first transistor T1 and the second transistor T2 described above are formed by using a patterning process, that is, the second conductive layer 40 described above is formed. Therefore, the source and drain electrodes of the third transistor T3 to the seventh transistor T7, the second capacitor electrode of the storage capacitor Cst, and the bottom gate electrodes of the first transistor T1 and the second transistor T2 are formed by one-time patterning process, which is beneficial to reduce the number of patterning processes and reduce the number of masks.

Figure 21:
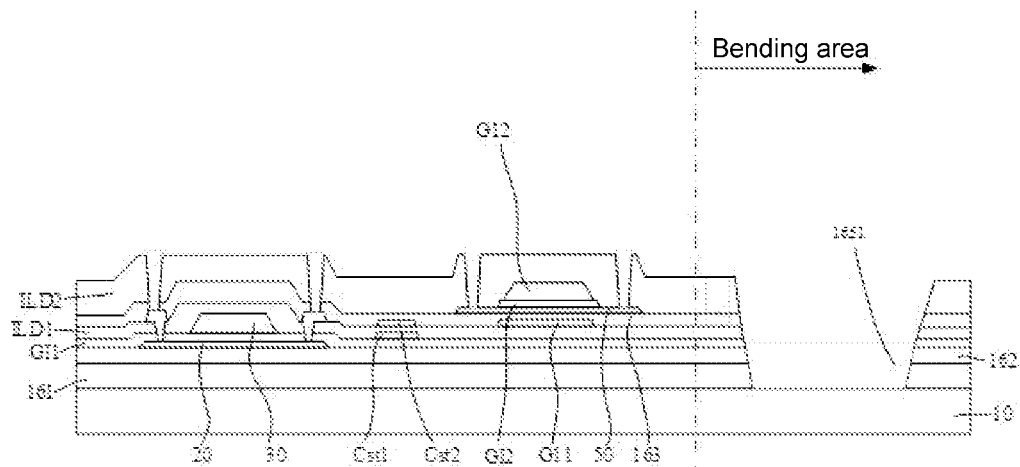

Referring to FIG. 21, in step S192, the second buffer layer 163 is formed on the second conductive layer 40.

An oxide semiconductor silicon island layer (that is, the second semiconductor layer 50) is prepared on the second buffer layer 163 by using a patterning process. The second gate insulating layer GI2 is formed on the second semiconductor layer 50, and a third conductive material layer is deposited. The top gate electrodes of the first transistor T1 and the second transistor T2 described above are formed in the third conductive material layer by using a patterning process, that is, the third conductive layer 60 described above is formed.

The second interlayer insulating layer ILD2 is formed in the third conductive layer 60. Then, a plurality of via holes that expose the source and drain electrodes of the third transistor T3 to the seventh transistor T7 described above as well as the source and drain regions of the active layers of the first transistor T1 and the second transistor T2 described above are formed in the second interlayer insulating layer ILD2 by using a patterning process. In addition, the patterning process may also be used to form the first groove portion 1651 in the second interlayer insulating layer ILD2. The first groove portion 1651 is located in the bending area 140, and penetrates at least the first interlayer insulating layer ILD1, the first gate insulating layer GI1 and the first buffer layer 162 so as to expose the portion of the base substrate 10 in the bending area 140.

Figure 22:
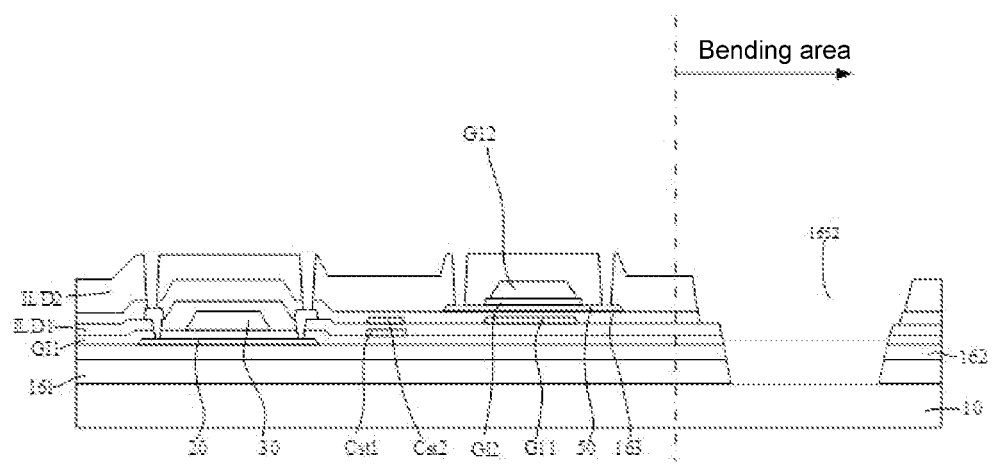

Referring to FIG. 22, in step S193, the second groove portion 1652 is formed in the bending area 140 by an etching process. The second groove portion 1652 penetrates at least the second buffer layer 163 and the second interlayer insulating layer ILD2. An orthographic projection of the second groove portion 1652 on the base substrate 10 covers an orthographic projection of the first groove portion 1651 on the base substrate 10, and has an area larger than that of the orthographic projection of the first groove portion 1651 on the base substrate 10. In this way, the stepped groove 165 is formed in the bending area 140.

Figure 23:
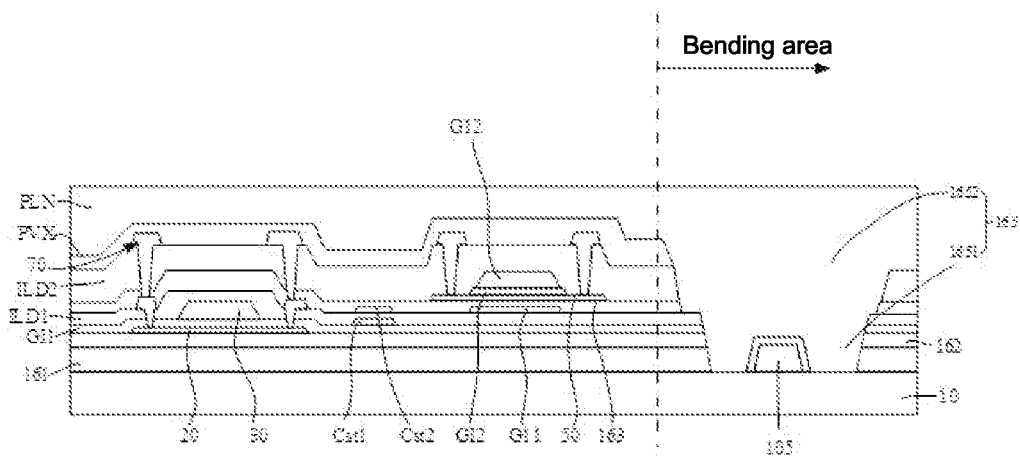

Referring to FIG. 23, in step S194, a fourth conductive material layer is formed on the second interlayer insulating layer ILD2 and at the bottom of the groove 165. The fourth conductive material layer is formed in the fourth conductive material layer by using a patterning process 70. For example, the fourth conductive layer 70 includes the first conductive component 701, the second conductive component 702, the third conductive component 703 and the fourth conductive component 704, and further includes the wire 105 located at the bottom of the groove 165.

Then, the passivation layer PVX is deposited, so that the passivation layer PVX covers the fourth conductive layer 70 described above. The planarization layer PLN is applied on the passivation layer PVX.

Referring to FIG. 16, in step S195, the first electrode 80, the pixel defining layer PDL and the spacer PS are sequentially prepared on the planarization layer PLN.

At least some embodiments of the present disclosure further provide a display panel including the display substrate as described above. For example, the display panel may be an OLED display panel.

Referring to FIG. 1, at least some embodiments of the present disclosure further provide a display device that may include the display substrate as described above.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, etc.

It should be understood that the display panel and the display device according to the embodiments of the present disclosure have all the features and advantages of the display substrate described above. The details may refer to the above description and will not be repeated here.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising:
a base substrate;
a first semiconductor layer on the base substrate; and
a second semiconductor layer on a side of the first semiconductor layer away from the base substrate;
wherein the display substrate further comprises a plurality of thin film transistors on the base substrate, and the plurality of thin film transistors at least comprise a first transistor and a third transistor,
wherein each of the plurality of thin film transistors comprises an active layer, the active layer of the first transistor is located in the second semiconductor layer and contains an oxide semiconductor material, the active layer of the third transistor is located in the first semiconductor layer and contains a polysilicon semiconductor material;
wherein the first transistor comprises a first bottom gate electrode between the base substrate and the active layer of the first transistor, and a first top gate electrode on a side of the active layer of the first transistor away from the base substrate; and any two of an orthographic projection of the active layer of the first transistor on the base substrate, an orthographic projection of the first bottom gate electrode on the base substrate and an orthographic projection of the first top gate electrode on the base substrate at least partially overlap each other;
wherein the display substrate comprises a first conductive layer and a second conductive layer on the base substrate, the first conductive layer is located on the side of the first semiconductor layer away from the base substrate, and the second conductive layer is located between the first conductive layer and the second semiconductor layer;
wherein the third transistor comprises a gate electrode located in the first conductive layer, and a source electrode and a drain electrode located in the second conductive layer; and
wherein the first bottom gate electrode is located in the second conductive layer,
wherein the display substrate further comprises:
a second transistor comprising a second bottom gate electrode located between the base substrate and the active layer of the second transistor, and a second top gate electrode located on a side of the active layer of the second transistor away from the base substrate,
wherein any two of an orthographic projection of the active layer of the second transistor on the base substrate, an orthographic projection of the second bottom gate electrode on the base substrate and an orthographic projection of the second top gate electrode on the base substrate at least partially overlap each other, and
wherein the active layer of the second transistor is located in the second semiconductor layer and contains the oxide semiconductor material, and the second bottom gate electrode is located in the second conductive layer,
wherein the display substrate further comprises:
a first bottom gate structure located in the second conductive layer, wherein the first bottom gate structure comprises a first bottom gate body portion and a first bottom gate extension portion, an orthographic projection of the first bottom gate body portion on the base substrate at least partially overlaps the orthographic projection of the active layer of the first transistor on the base substrate, and the first bottom gate electrode comprises a portion of the first bottom gate body portion that overlaps the active layer of the first transistor; and/or a second bottom gate structure located in the second conductive layer, wherein the second bottom gate structure comprises a second bottom gate body portion and a second bottom gate extension portion, an orthographic projection of the second bottom gate body portion on the base substrate at least partially overlaps the orthographic projection of the active layer of the second transistor on the base substrate, and the second bottom gate electrode comprises a portion of the second bottom gate body portion that overlaps the active layer of the second transistor, wherein the display substrate further comprises a data line for transmitting a data signal, wherein the data line extends in a first direction on the base substrate, and at least one of the first bottom gate extension portion and the second bottom gate extension portion extends in the first direction; and wherein at least one of the active layer of the first transistor and the active layer of the second transistor extends in the first direction, wherein the display substrate further comprises:
a third conductive layer on a side of the second semiconductor layer away from the base substrate; and
a first top gate structure located in the third conductive layer, wherein the first top gate structure extends in a second direction intersecting the first direction;

wherein the first top gate structure comprises a first widened portion, a size of the first widened portion in the first direction is greater than that of a remaining portion of the first top gate structure in the first direction; and wherein an orthographic projection of the first widened portion on the base substrate at least partially overlaps the orthographic projection of the active layer of the first transistor on the base substrate, and the first top gate electrode comprises a portion of the first widened portion that overlaps the active layer of the first transistor.

2. The display substrate of claim 1, further comprising a storage capacitor comprising a first capacitor electrode and a second capacitor electrode on the base substrate,
wherein an orthographic projection of the first capacitor electrode on the base substrate at least partially overlaps an orthographic projection of the second capacitor electrode on the base substrate; and
wherein the second capacitor electrode is located in the second conductive layer, and the first capacitor electrode is located in the first conductive layer.

3. The display substrate of claim 1, further comprising a second top gate structure located in the third conductive layer, wherein the second top gate structure extends in the second direction;
wherein the second top gate structure comprises a second widened portion, a size of the second widened portion in the first direction is greater than that of a remaining portion of the second top gate structure in the first direction; and
wherein an orthographic projection of the second widened portion on the base substrate at least partially overlaps the orthographic projection of the active layer of the second transistor on the base substrate, and the second top gate electrode comprises a portion of the second widened portion that overlaps the active layer of the second transistor.

4. The display substrate of claim 3, wherein the first widened portion protrudes to both sides with respect to the remaining portion of the first top gate structure in the first direction; and/or
wherein the second widened portion protrudes to both sides with respect to the remaining portion of the second top gate structure in the first direction.

5. The display substrate of claim 1, further comprising a fourth conductive layer on a side of the third conductive layer away from the base substrate;
wherein the first transistor comprises a first source electrode and a first drain electrode, the second transistor comprises a second source electrode and a second drain electrode, and the first source electrode, the first drain electrode, the second source electrode and the second drain electrode are located in the fourth conductive layer.

6. The display substrate of claim 5, further comprising:
an initialization voltage line located in the third conductive layer, wherein the initialization voltage line is configured to transmit an initialization voltage signal; and
a first conductive component located in the fourth conductive layer, wherein the first conductive component has one end electrically connected to the active layer of the first transistor through a first via hole, and a portion of the first conductive component is electrically connected to the initialization voltage line through a second via hole.

7. The display substrate of claim 6, further comprising a second conductive component and a third conductive component located in the fourth conductive layer, wherein the second conductive component has a first end electrically connected to the active layer of the second transistor through a third via hole, and a second end electrically connected to the active layer of the first transistor and a first end of the third conductive component through a fourth via hole; and
wherein the display substrate further comprises a storage capacitor comprising a first capacitor electrode and a second capacitor electrode on the base substrate, and an orthographic projection of the first capacitor electrode on the base substrate at least partially overlaps an orthographic projection of the second capacitor electrode on the base substrate, and the second capacitor electrode is located in the second conductive layer, the first capacitor electrode is located in the first conductive layer, and
wherein a second end of the third conductive component is electrically connected to the gate electrode of the third transistor and the first capacitor electrode through a fifth via hole.

8. The display substrate of claim 7, further comprising a light emitting device on the base substrate, wherein the light emitting device comprises at least a first electrode located on a side of the fourth conductive layer away from the base substrate; and
wherein an orthographic projection of the first electrode on the base substrate at least partially overlaps the orthographic projection of the active layer of the first transistor on the base substrate.

9. The display substrate of claim 8, wherein the orthographic projection of the first electrode on the base substrate is spaced from the orthographic projection of the active layer of the second transistor on the base substrate.

10. The display substrate of claim 9, further comprising a pixel defining layer and a spacer on the base substrate, wherein the pixel defining layer comprises an opening that exposes at least a portion of the first electrode, and the spacer is located on a side of the pixel defining layer away from the base substrate; and wherein an orthographic projection of the spacer on the base substrate at least partially overlaps the orthographic projection of the active layer of the second transistor on the base substrate.

11. The display substrate of claim 10, further comprising:

a first buffer layer located between the base substrate and the first semiconductor layer, wherein the first buffer layer contains silicon oxide or silicon nitride; and/or a first gate insulating layer located between the first semiconductor layer and the first conductive layer, wherein the first gate insulating layer contains silicon oxide; and/or a second buffer layer located between the second conductive layer and the second semiconductor layer, wherein the second buffer layer contains silicon oxide; and/or a second gate insulating layer located between the second semiconductor layer and the third conductive layer, wherein the second gate insulating layer contains silicon oxide.

12. The display substrate of claim 11, wherein the display substrate is a bendable flexible display substrate comprising a display area and a bending area; and wherein the display substrate further comprises a groove located in the bending area, and the groove exposes at least a portion of the base substrate located in the bending area.

13. The display substrate of claim 12, further comprising a wire located in the bending area, wherein the wire is located in the fourth conductive layer and on a bottom of the groove.

14. The display substrate of claim 13, further comprising:

a passivation layer located on a side of the fourth conductive layer away from the base substrate, wherein a portion of the passivation layer at least covers the wire; and a planarization layer located on a side of the passivation layer away from the base substrate, wherein the planarization layer is filled in the groove.

15. A display panel comprising the display substrate of claim 1.

16. A display device comprising the display substrate of claim 1.

* * * * *